United States Patent
Nakajima et al.

[11] Patent Number: 5,907,188
[45] Date of Patent: May 25, 1999

[54] SEMICONDUCTOR DEVICE WITH CONDUCTIVE OXIDATION PREVENTING FILM AND METHOD FOR MANUFACTURING THE SAME

[75] Inventors: Kazuaki Nakajima, Tokyo; Yasushi Akasaka, Yokohama; Kiyotaka Miyano, Tokyo; Kyoichi Suguro, Yokohama, all of Japan

[73] Assignee: Kabushiki Kaisha Toshiba, Kawasaki, Japan

[21] Appl. No.: 08/701,716

[22] Filed: Aug. 22, 1996

[30] Foreign Application Priority Data

Aug. 25, 1995 [JP] Japan .................................. 7-217882
Aug. 25, 1995 [JP] Japan .................................. 7-240735
Mar. 18, 1996 [JP] Japan .................................. 8-060953
Jul. 18, 1996 [JP] Japan .................................. 8-189054

[51] Int. Cl.$^6$ ............................ H01L 23/48; H01L 23/52; H01L 29/40; H01L 29/76
[52] U.S. Cl. ........................ 257/751; 257/412; 257/757; 438/653; 438/656
[58] Field of Search .................... 257/412, 750, 257/751, 757; 438/653, 656

[56] References Cited

U.S. PATENT DOCUMENTS

| | | |
|---|---|---|
| 5,341,016 | 8/1994 | Prall et al. . |
| 5,573,965 | 11/1996 | Chen et al. .............................. 438/297 |
| 5,576,579 | 11/1996 | Agnello et al. .......................... 257/751 |

FOREIGN PATENT DOCUMENTS

| | | |
|---|---|---|
| 58-166770 | 10/1983 | Japan . |
| 59-132136 | 7/1984 | Japan . |
| 60-9166 | 1/1985 | Japan . |
| 60-195975 | 10/1985 | Japan . |
| 62-203370 | 9/1987 | Japan . |
| 2-155273 | 6/1990 | Japan . |
| 3-119763 | 5/1991 | Japan . |
| 7-94716 | 4/1995 | Japan . |

OTHER PUBLICATIONS

"Ti–Si–N Diffusion Barriers Between Silicon and Copper," J. S. Reid et al. IEEE Electron Device Letters, vol. 15, No. 8, Aug. 1994; pp. 298–300.

"A Nitride–Isolated Molybdenum–Polysilicon Gate Electrode For MOS VLSI Circuits," Takashi I to et al. IEEE Transactions On Electron Devices, vol. ED–33, No. 4, Apr. 1986; pp. 464–468.

"Sputtered Ta–Si–N Diffusion Barriers In Cu Metallizations For Si," E. Kolawa et al. IEEE Electron Device Letters, vol. 12, No. 6, Jun. 1991; pp. 321–323.

"An Inexpensive Diffusion Barrier Technology For Polycide Gate Electrodes With An SiN Layer Formed With ECR Nitrogen Plasma," Tetsuo Hosoya et al. Extended Abstracts Of The 1994 International Conference On Solid State Devices And Materials, Aug. 23, 1994; pp. 422–424.

Extended Abstracts (The 41st Spring Meeting, 1994). The Japan Society Of Applied Physics And Related Societies, S. Suehiro et al.; p. 684.

(List continued on next page.)

*Primary Examiner*—Donald L. Monin, Jr.
*Assistant Examiner*—Howard Weiss
*Attorney, Agent, or Firm*—Oblon, Spivak, McClelland, Maier & Neustadt, P.C.

[57] ABSTRACT

A semiconductor device includes a semiconductor substrate, and a laminated film insulatively formed over the semiconductor substrate, wherein the laminated film includes a semiconductor film, a metal film of refractory metal formed on the semiconductor film, a conductive oxidation preventing film disposed between the metal film and the semiconductor film, for preventing oxidation of the semiconductor film in an interface between the metal film and the semiconductor film, and an oxide film formed on a side surface of the semiconductor film and formed to extend into upper and lower portions of the semiconductor film in a bird's beak form.

12 Claims, 22 Drawing Sheets

OTHER PUBLICATIONS

Extended Abstracts (The 41st Spring Meeting, 1994). The Japan Society Of Applied Physics And Related Societies, Y. Akasaka et al.; p. 684.

"Low–Resistivity Poly–Metal Gate Electrode Durable For High–Temperature Processing," Y. Akasaka et al. Proc. Of 12th VLSI Multilevel Interconnection Conference, Jun. 27–29, 1995; pp. 168–174.

Poly–Metal Gate Process—Ultrathin WSiN Barrier Layer Impermeable To Oxidant In–Diffusion During Si Selective Oxidation, K. Nakajima et al., Proc. Adv. Metalization For ULSI p., 51, Oct. 23, 1995.

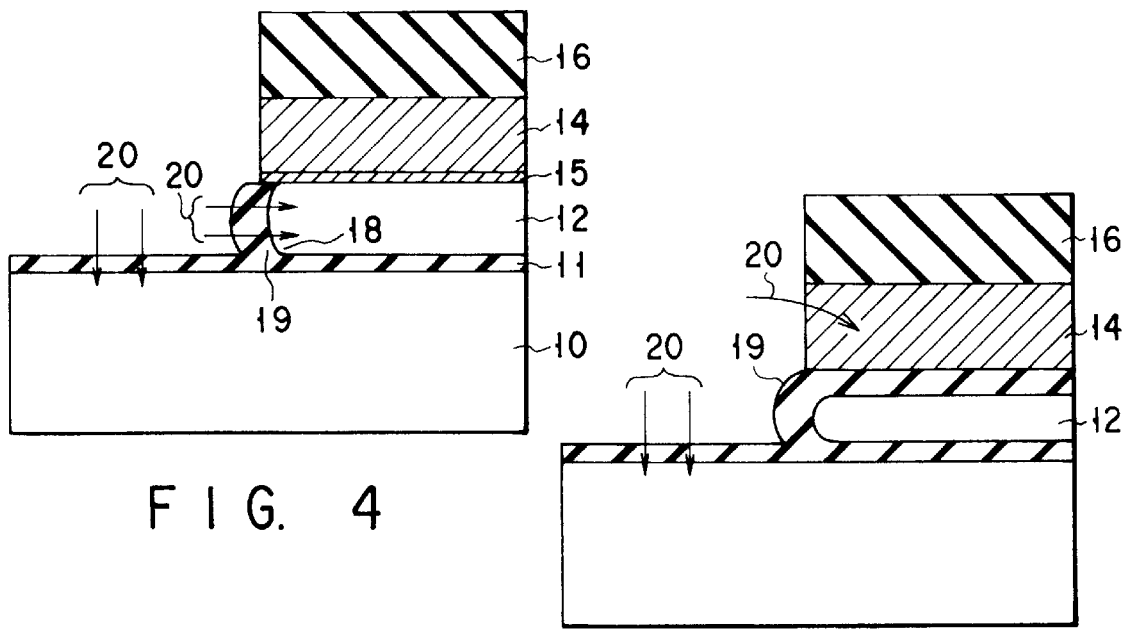
F I G. 4
F I G. 5 PRIOR ART
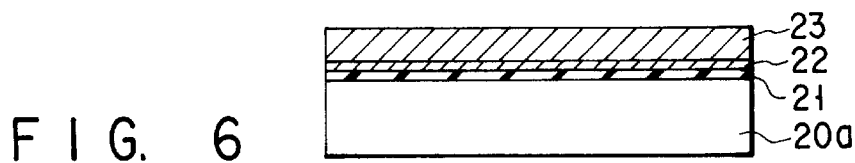
F I G. 6
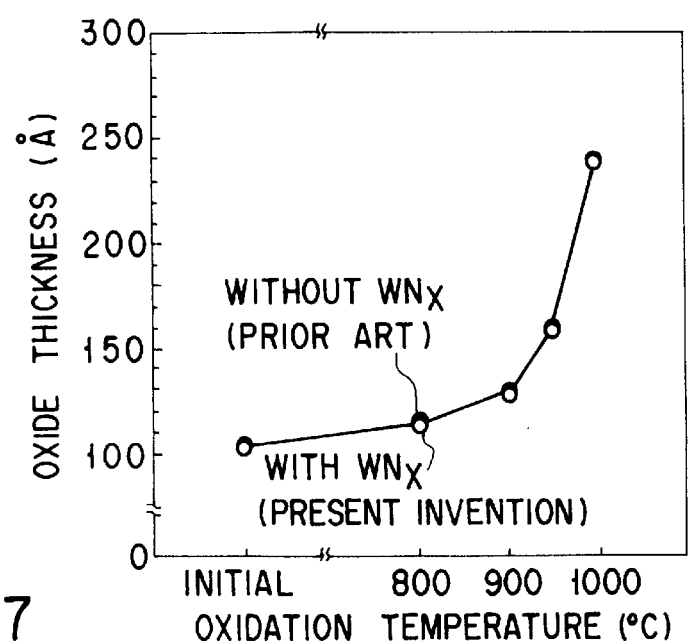
F I G. 7

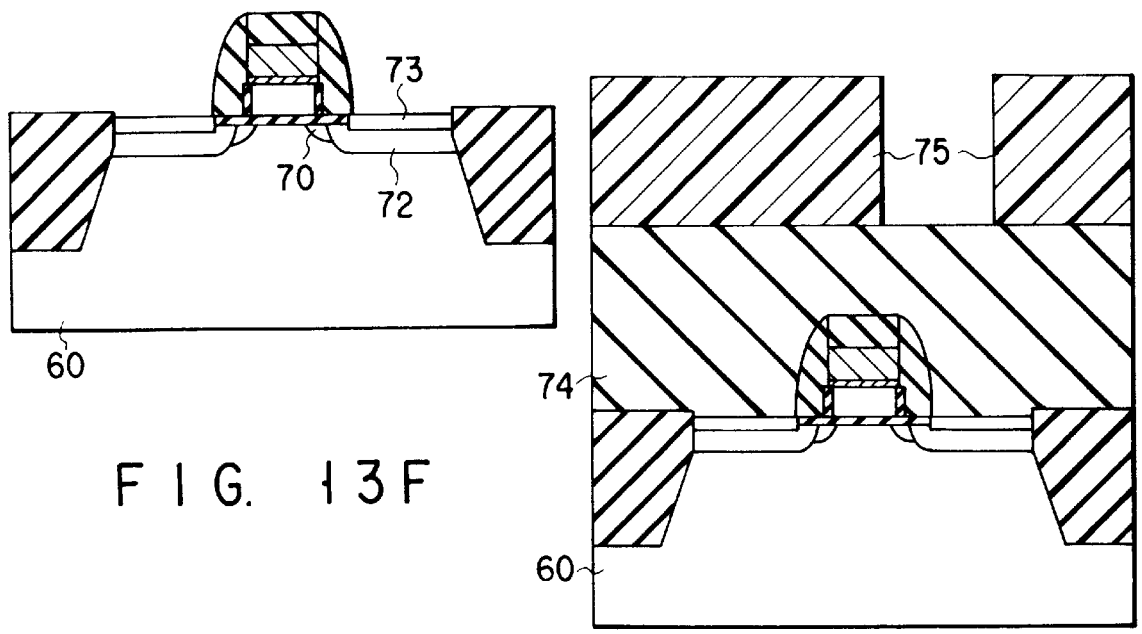
FIG. 13F
FIG. 13G
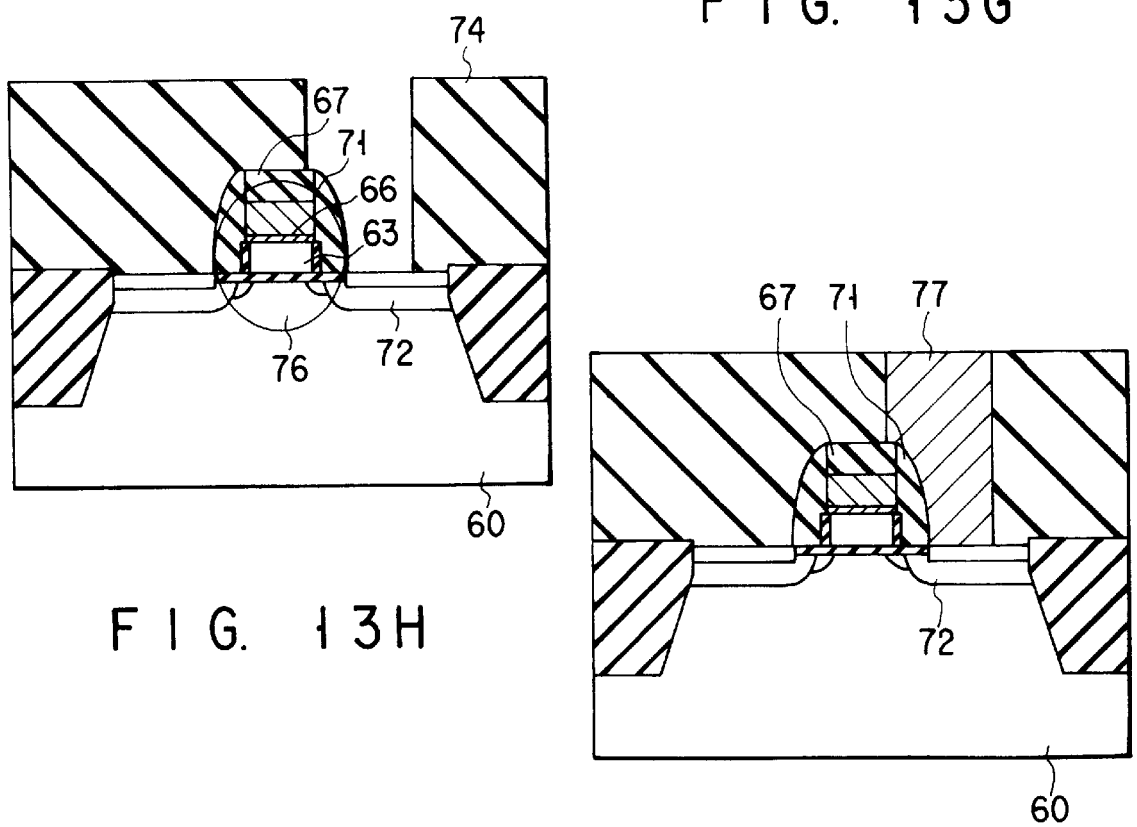
FIG. 13H
FIG. 13I

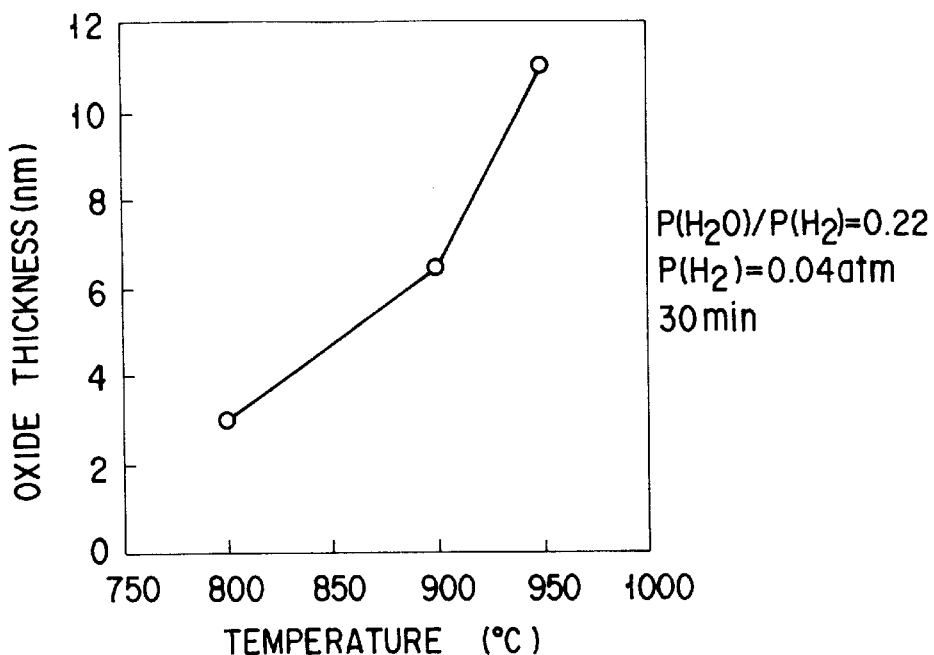
F I G. 18
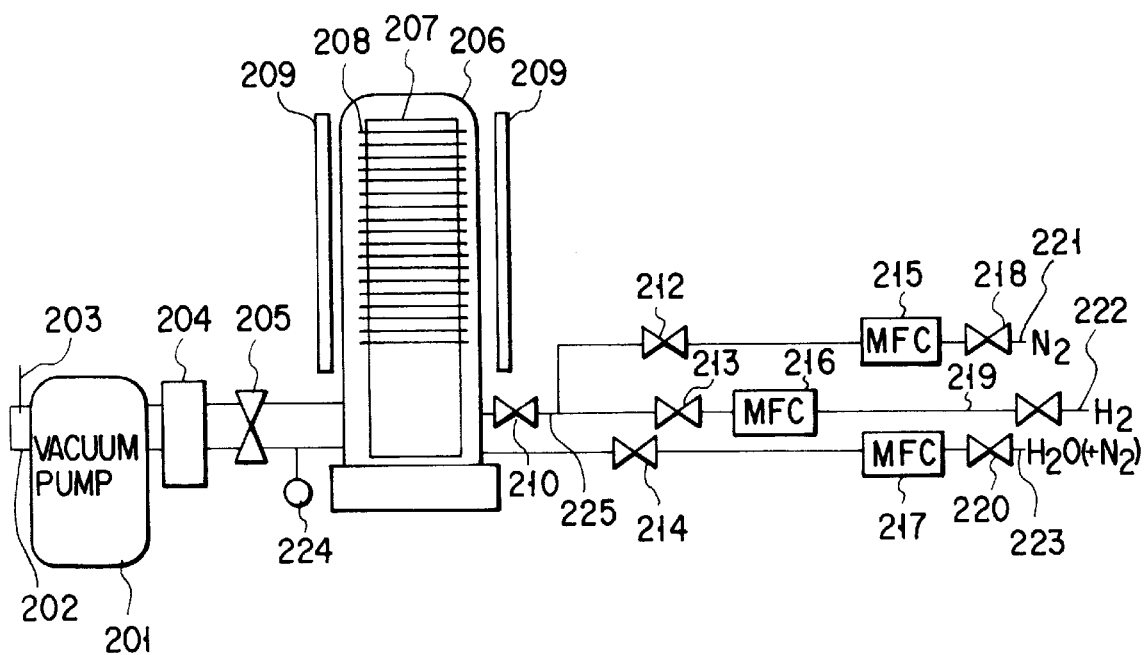
F I G. 20

AFTER POLYMETAL RIE
(BEFORE POST-OXDIATION)

4nm THICKNESS OXIDE
ON Si SUBSTRATE

12nm THICKNESS OXIDE ON Si SUBSTRATE

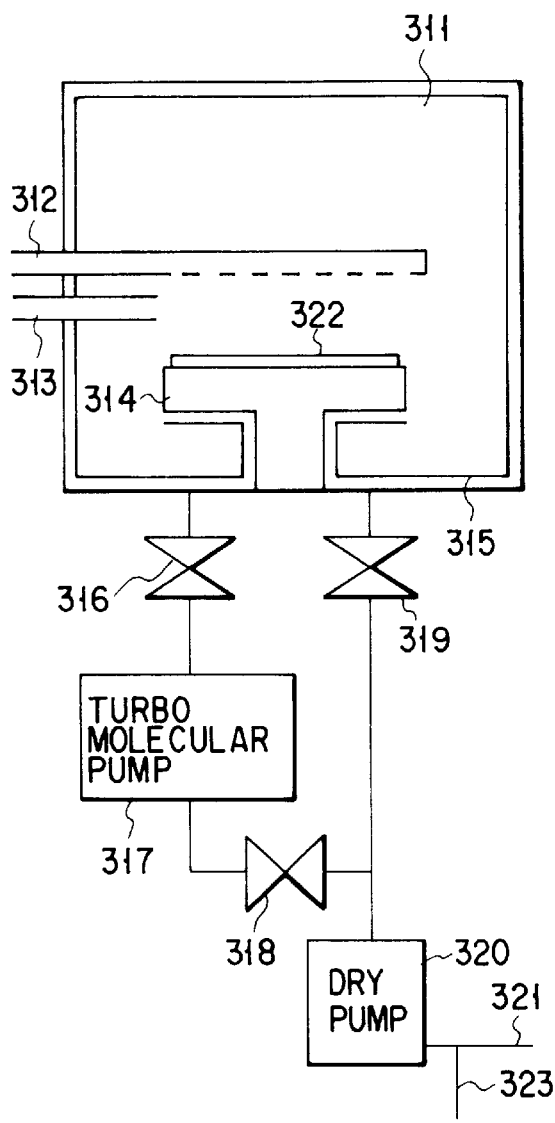
F I G. 2 1
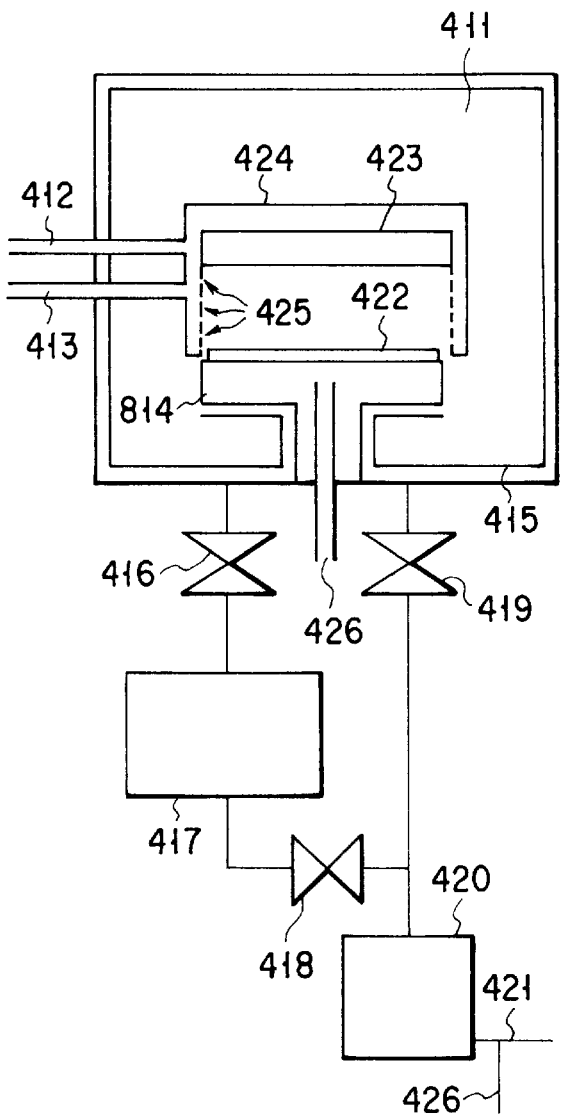
F I G. 2 2

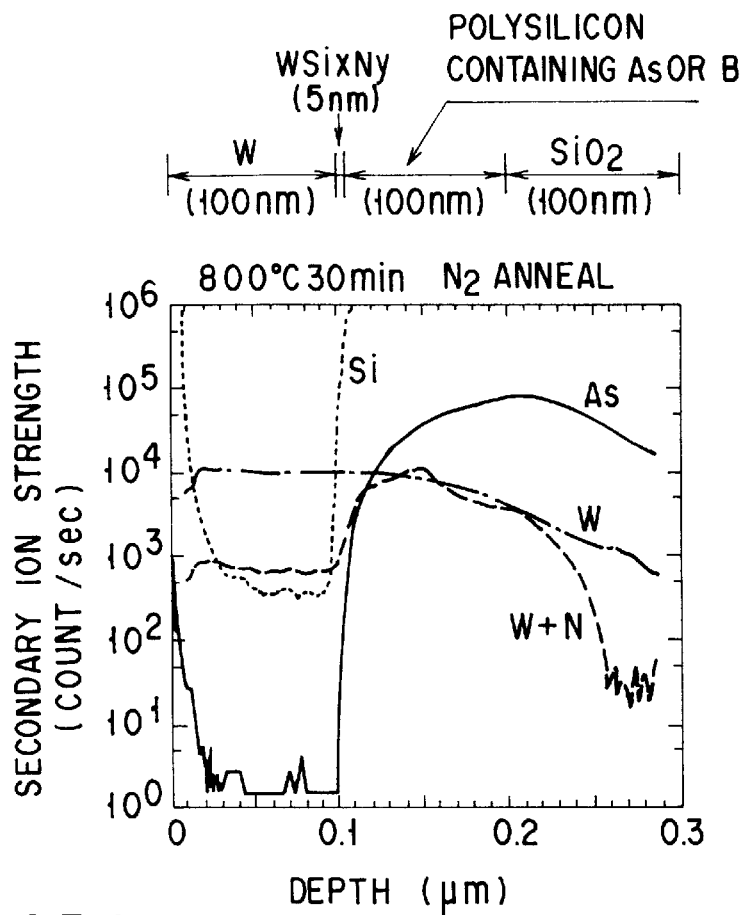
F I G. 23A
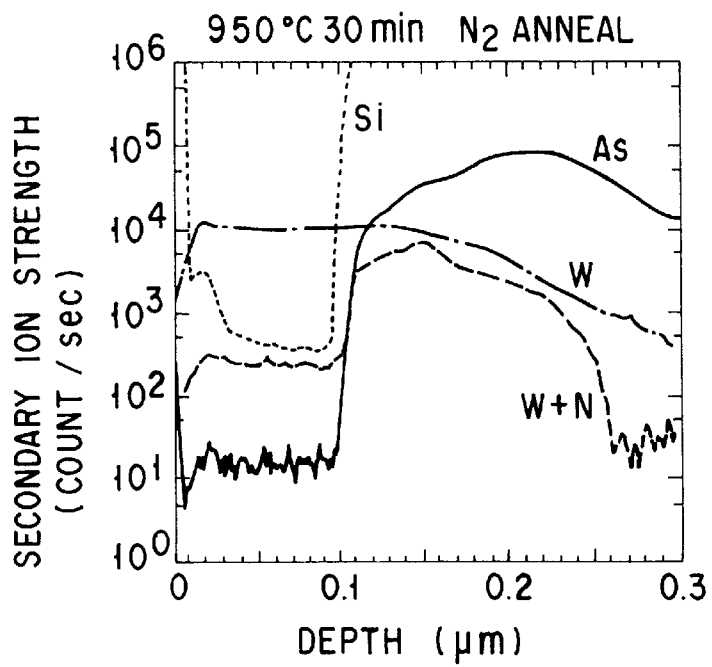
F I G. 23B

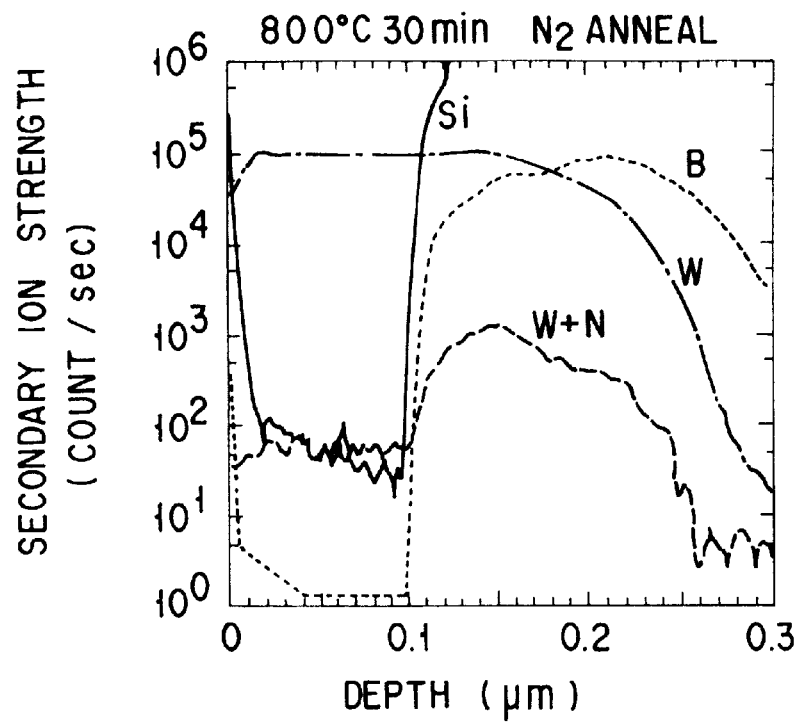
F I G. 24A
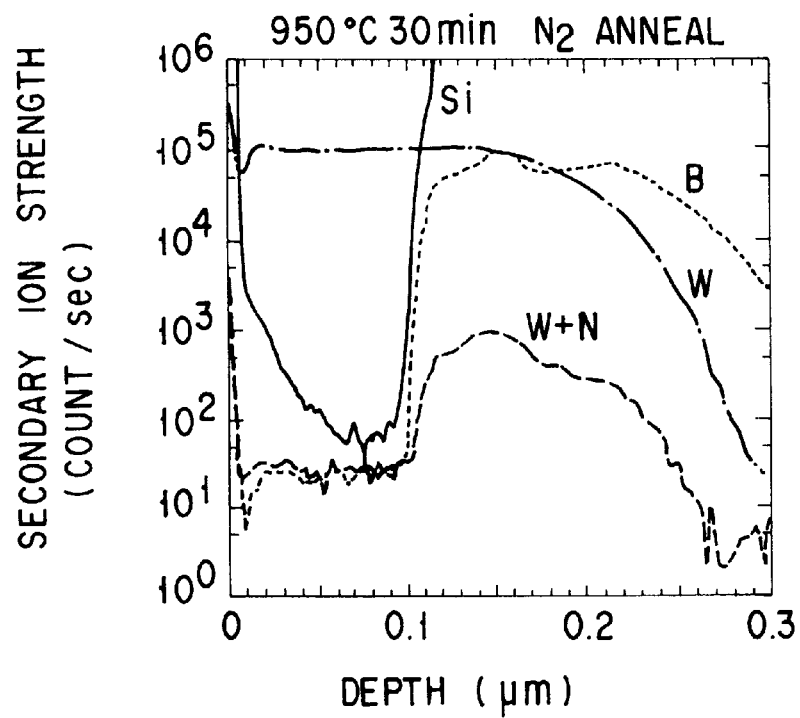
F I G. 24B

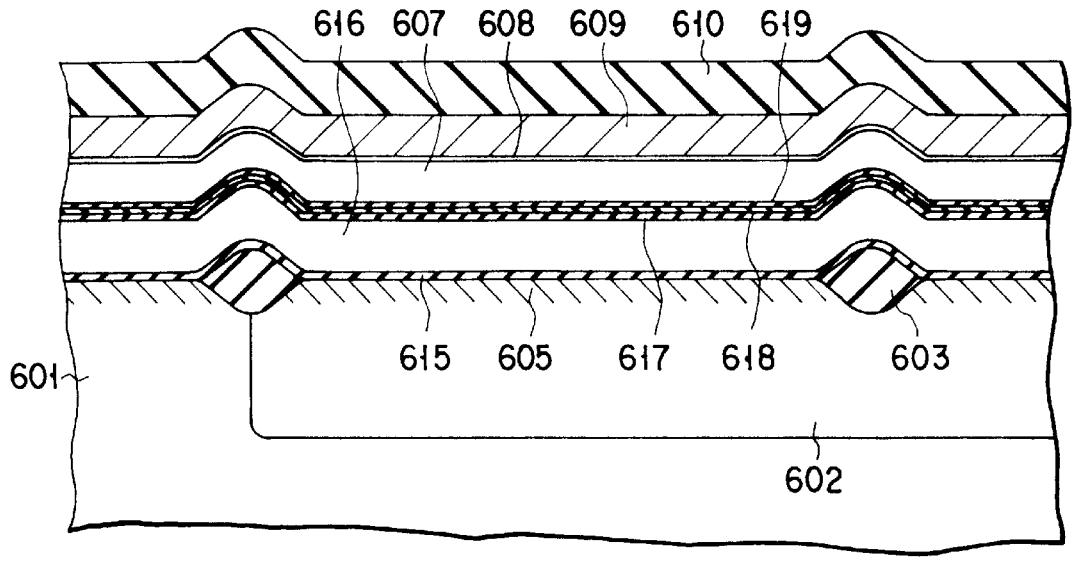
F I G. 26A
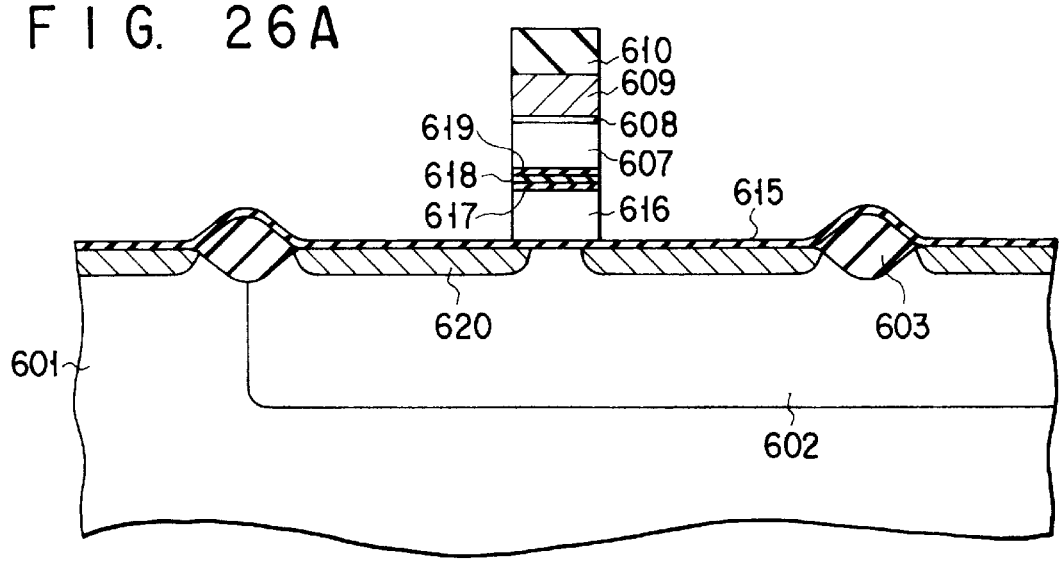
F I G. 26B
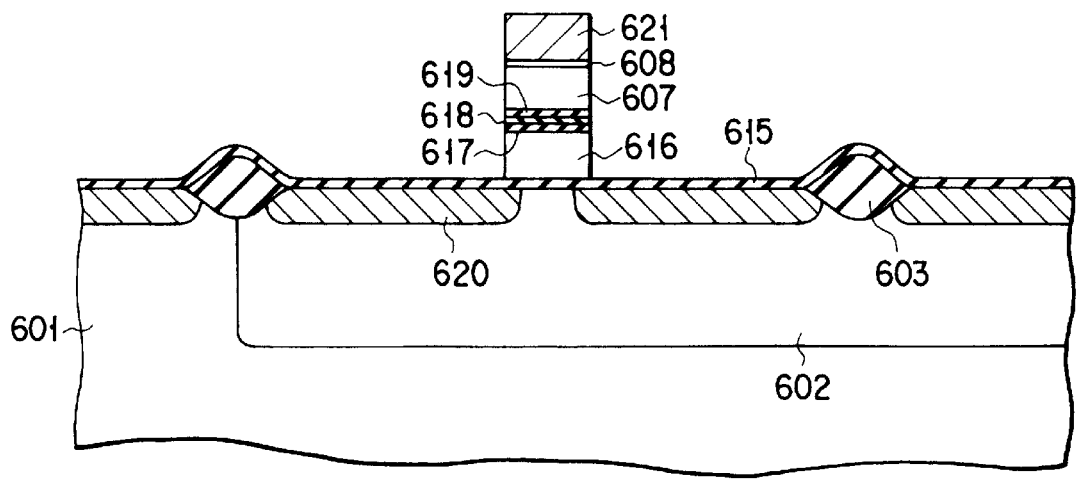
F I G. 27

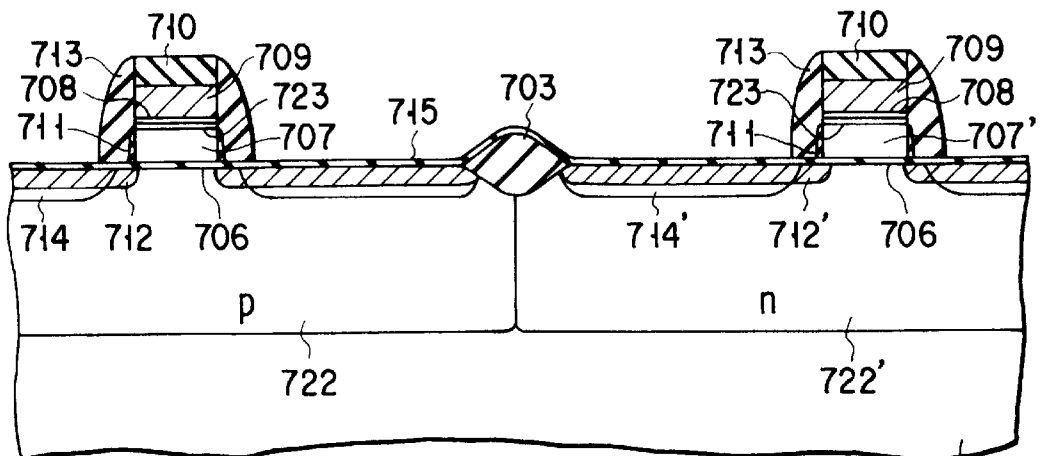
FIG. 28
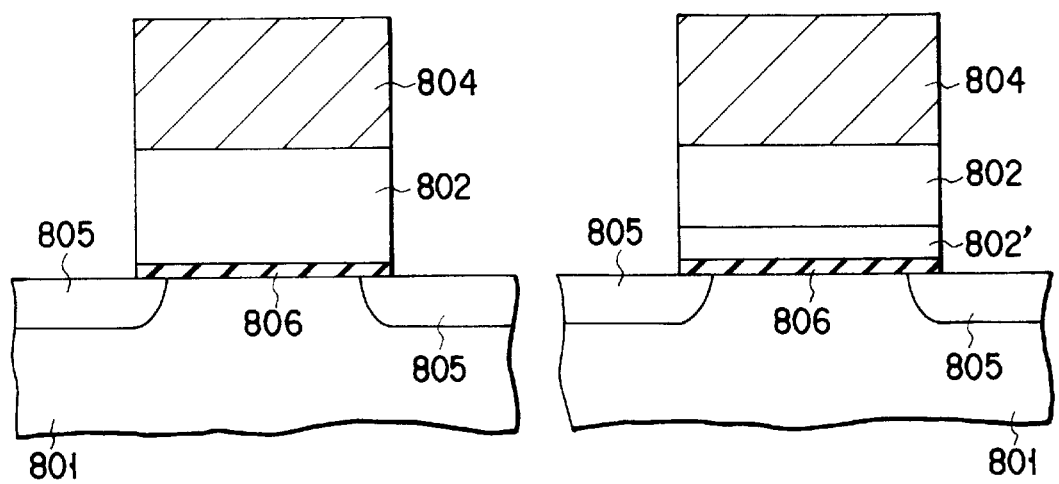
FIG. 29A
PRIOR ART
FIG. 29B
PRIOR ART
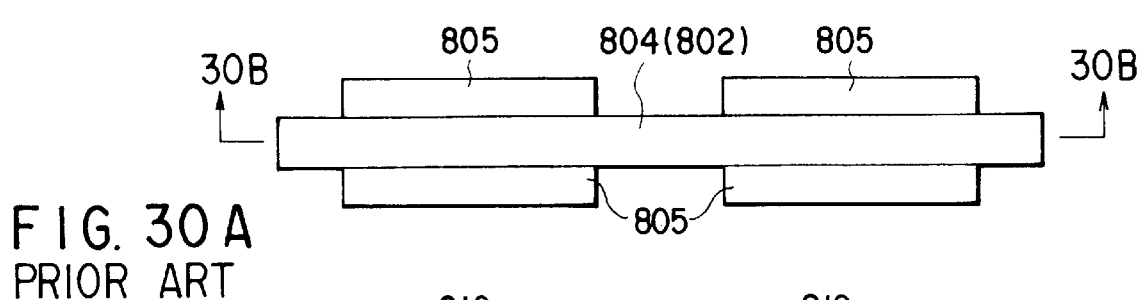
FIG. 30A
PRIOR ART
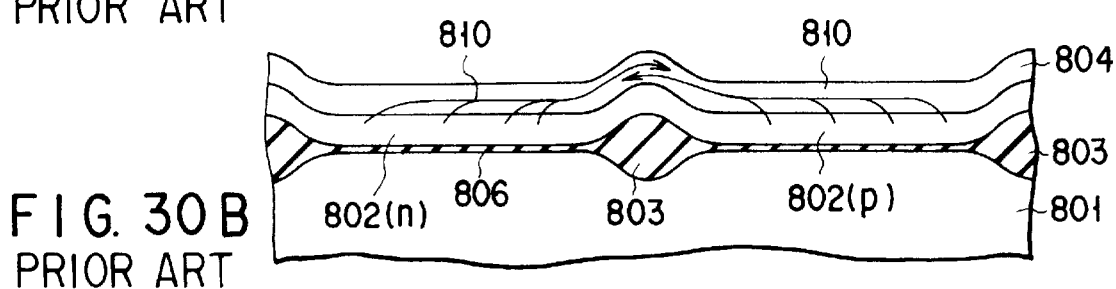
FIG. 30B
PRIOR ART

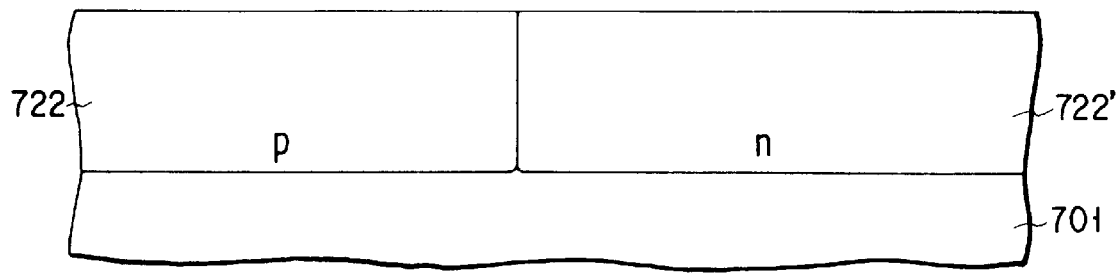
F I G. 31A
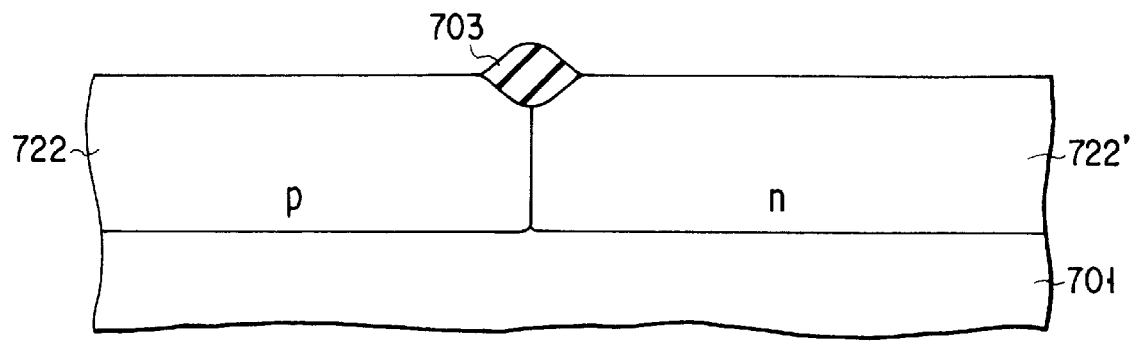
F I G. 31B
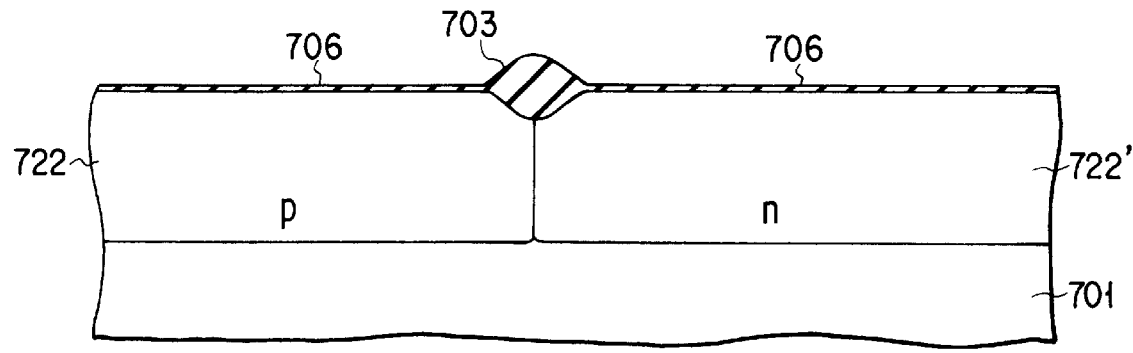
F I G. 31C
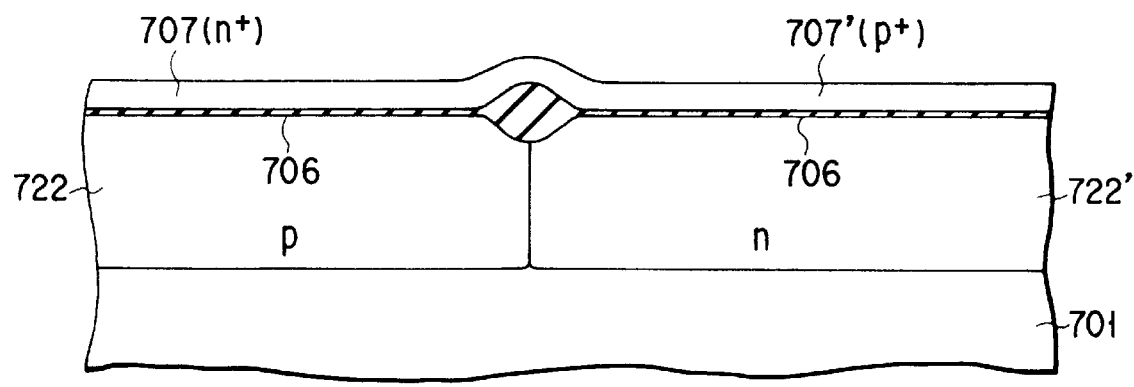
F I G. 31D

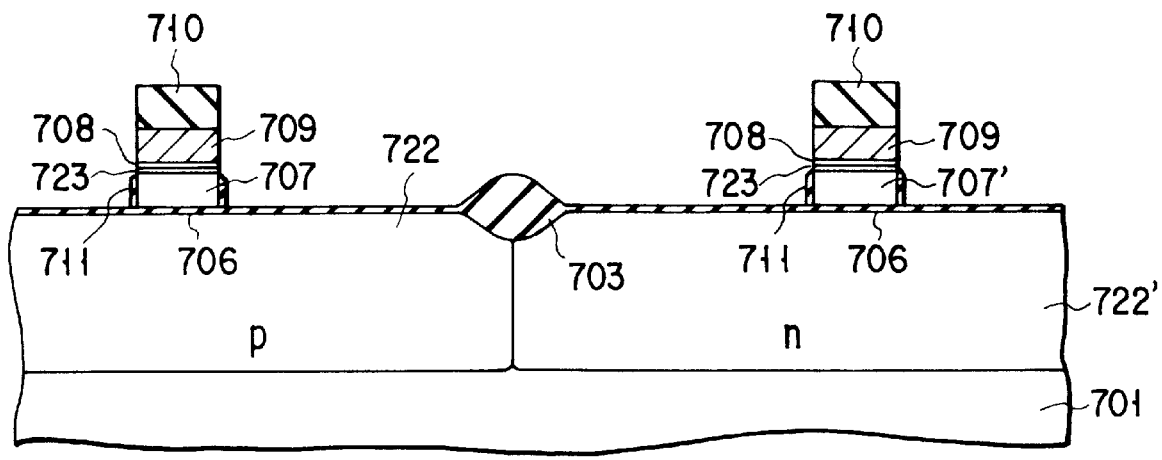
F I G. 31 H
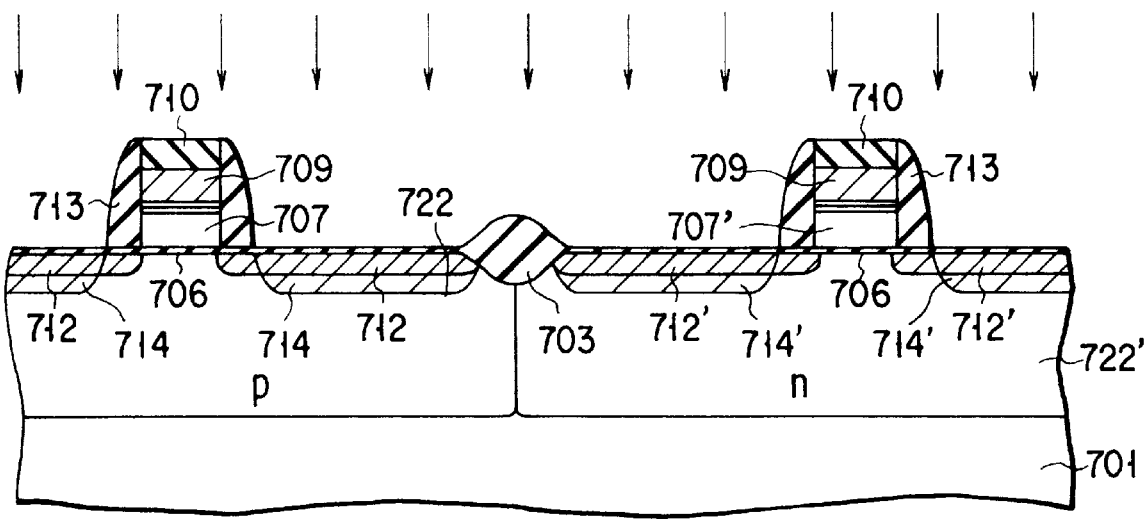
F I G. 31 I

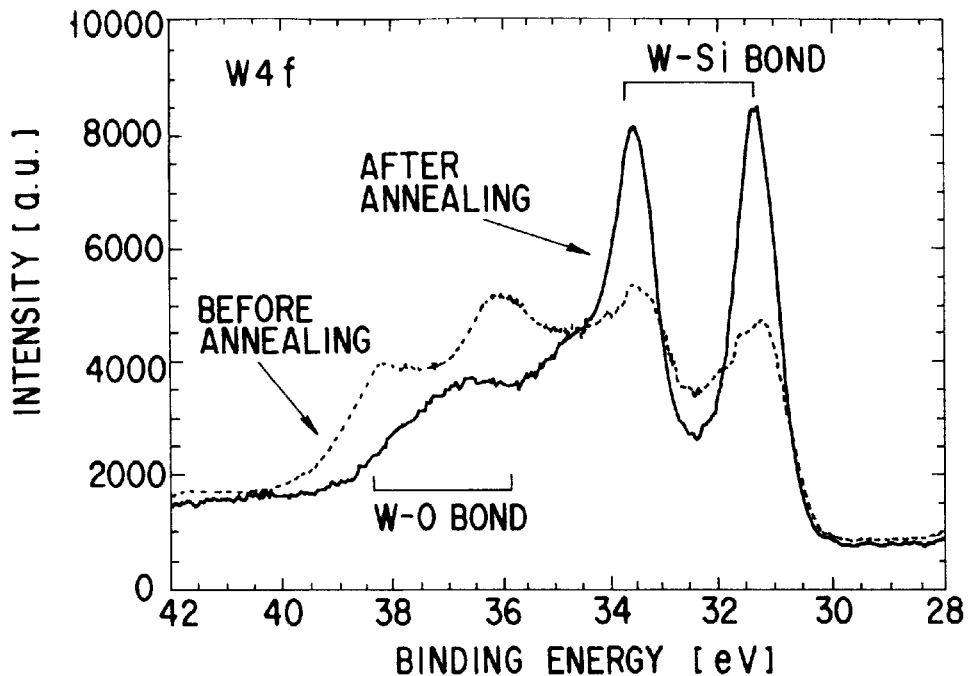
F I G. 32A
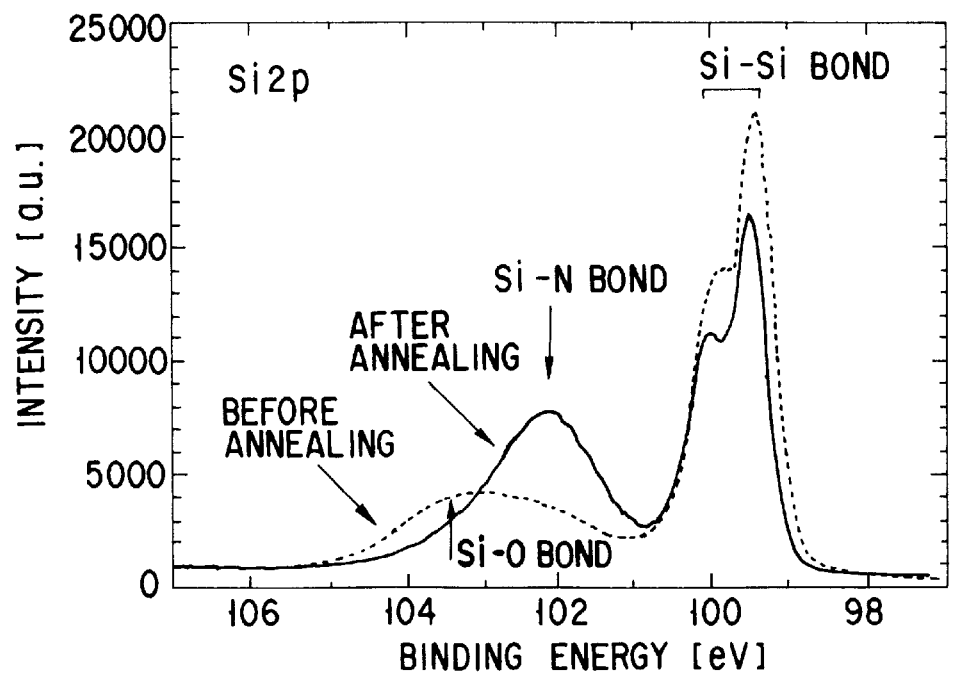
F I G. 32B

SEMICONDUCTOR DEVICE WITH CONDUCTIVE OXIDATION PREVENTING FILM AND METHOD FOR MANUFACTURING THE SAME

BACKGROUND OF THE INVENTION

1. Field of the Invention

This invention relates to a semiconductor device having a feature in the electrode of laminated structure and having a preferable impurity-diffusion preventing function.

2. Description of the Related Art

Recently, polysilicon is widely used as a material of electrodes and wirings of semiconductor devices. However, with an increase in the integration density and operation speed of the semiconductor device, delay in the signal transmission due to the resistances of the electrode and wiring becomes an important problem.

This type of delay can be suppressed by lowering the resistances of the electrode and wiring. For example, in the case of a gate electrode of a MOS transistor, the delay can be suppressed by use of a polycide gate with two-layered structure of a metal silicide film and a polysilicon film.

However, in the generation of the gate length 0.25 $\mu$m and in the succeeding generations, it is required to use a gate electrode having lower resistance than the polycide gate, and recently, a polymetal gate with laminated structure of a refractory metal film, reaction barrier layer and polysilicon layer has received much attention.

If tungsten (W) is used as refractory metal, the RC delay time can be significantly reduced since the specific resistance of tungsten is smaller than that of tungsten silicide ($WSi_x$) by approximately an order of magnitude. Tungsten is a material which easily reacts with polysilicon in the heat treatment of approximately 600° C., but no problem occurs since a reaction barrier layer is disposed between the W film and the polysilicon film.

Further, a metal gate of single-layered refractory metal film is expected to be widely used in the future rather than the polymetal gate. It is necessary to use refractory metal in order to lower the resistance of the gate electrode.

However, the refractory metal such as tungsten tends to be easily oxidized and, for example, tungsten is oxidized at approximately 400° C. The oxide of tungsten is an insulator and tungsten causes the cubical expansion with oxidation.

Generally, in the LSI manufacturing process, it is necessary to use a step of effecting re-oxidation for enhancing the reliability of an oxide film such as a gate oxide film after the gate electrode pattern is formed. For example, in the case of a polysilicon gate, a polysilicon film is formed on a silicon substrate and patterned into a gate electrode, and then an oxide portion called a bird's beak is formed on the end portion of the gate oxide film. As a result, since the lower end portion of the gate electrode is rounded and the electric field around the gate portion can be reduced, the characteristic and reliability of the element can be enhanced. The re-oxidation step is hereinafter referred to as post-oxidation.

If this type of post-oxidation is applied to a polycide gate using $WSi_x$ as metal silicide, $WSi_x$ which contains rich Si in comparison with the normal composition x=2.0 is used as $WSi_x$, and therefore, excessive silicon in $WSi_x$ is oxidized in the post-oxidation step to form $SiO_2$ on the $WSi_x$ surface and the same insulating effect as that obtained by the oxidation method for crystal silicon can be attained.

If this type of post-oxidation is applied to a polymetal gate using W as refractory metal, W is oxidized in the normal oxidation step and $WO_3$ is formed in the normal oxidation step. At this time, since large cubical expansion occurs, the film may be removed and the succeeding step cannot be continuously effected.

Further, oxidation of W is started by an oxidant such as $O_2$ and $H_2O$ introduced from the atmosphere before the oxidation step is started and the same problem may occur. Therefore, in the case of polymetal gate, it is necessary to use the technique (selective oxidation technique) for oxidizing only silicon without oxidizing refractory metal in the post-oxidation step.

A selective oxidation method for selectively oxidizing only silicon without oxidizing the exposed portion of refractory metal in a case where the exposed portion of silicon and the exposed portion of refractory metal such as W are both present on the same substrate as in the case of polymetal gate is known (Jpn. Pat. Appln. KOKAI Publication No. 60-9166).

The selective oxidation method is a method for effecting the oxidation with the partial pressure ratio of $H_2O/H_2$ kept constant when the oxidation is effected in the mixed atmosphere of $H_2O$ which is an oxidant and $H_2$ which is a reducer.

As an example of application of the above technique, there is a report (R. F. Kwasnick et al., J. Electrochem. Soc., Vol 135, pp 176 (1988)) that the metal gate of a single layer of W is oxidized in the $H_2/H_2O$ atmosphere. According to the result of experiments made by the reporters, when a sample obtained by stacking a W film (gate electrode) of 200 nm thickness on a thin silicon oxide film (gate oxide film) of 5 nm thickness was used and an oxidation process was effected at 900° C. for approximately 30 minutes in the $H_2/H_2O$ atmosphere, the thickness of the silicon oxide film lying directly under the W film was increased to 20 nm.

The phenomenon is caused by diffusion of the oxidant through the grain boundary of the W film. That is, the above selective oxidation technique does not oxide the W film, but silicon in the silicon oxide film lying directly under the W film is oxidized. Therefore, when the above selective oxidation technique is applied to the metal gate, the film thickness of the gate oxide film is increased, thereby causing a serious problem that the driving ability of a transistor is lowered.

When considering that the above selective oxidation technique is applied to a polymetal gate with laminated structure of a W film and a polysilicon film, it can be easily supposed that the polysilicon film lying directly under the W film will also be oxidized. Oxidation of the polysilicon film on the interface between the W film and the polysilicon film causes an increase in the contact resistance in the interface, causing a problem that the RC delay is increased.

However, the selective oxidation using the mixed gas of $H_2O$ gas and $H_2$ gas has the following problem.

The $H_2$ gas which is a reducer explodes at temperatures of 600° C. or more in the density range of 4% to 75%. On the other hand, oxidation of silicon is generally effected at a high temperature of 600° C. or more. Therefore, the selective oxidation method using the mixed gas of $H_2O$ gas and $H_2$ gas has a problem in its safety.

For example, a temperature rise occurring when hydrogen of 60% is completely burnt is 3500° C., and at this time, the volume expands by 4.3 times, and as a result, not only the device for oxidation is broken but also the surrounding is put into a dangerous condition.

For this reason, when the selective oxidation method is used, it is necessary to provide a device having a safety mechanism. As the safety mechanism, a mechanism for maintaining the reaction chamber in such a state that the reaction chamber will not explode or a mechanism capable of maintaining the safe state even if oxygen is introduced for some reason is necessary. Therefore, in order to actually use the above selective oxidation method, the above safety mechanism is required and the whole device is made complicated and the cost thereof becomes high.

As described above, in order to lower the resistance of the gate electrode, the electrode structure having a high electrical conductivity and a high degree of matching with the gate insulating film and the substrate may be formed by laminating metal with high electrical conductivity on polysilicon, but the gate electrode obtained by a combination with normal metal cannot withstand high temperatures set in the LSI manufacturing process. Particularly, in the self-aligned ion-implantation technique using the gate electrode as a mask and introduced together with miniaturization of elements and enhancement of the operation speed, the activation heat treatment after ion-implantation must be effected after formation of the gate electrode, and therefore, the gate electrode is required to have high resistance to heat.

Furthermore, in the high temperature processes at 800 to 900° C. after the ion-implantation, including the above-mentioned oxidation, owing to the thermal diffusion of Si atoms or doped impurity atoms from the polysilicon to the refractory metal or a silicide thereof, the problem arises that a gate depletion is induced due to impurity concentration lowering in the silicon layer, or a work function in a CMOSFET (complemental MOSFET) is varied by the fact that impurities in n and p regions are mutually diffused through the above refractory metal or a silicide thereof, thereby varying a threshold voltage of the CMOSFET.

SUMMARY OF THE INVENTION

A first object of this invention is to provide a semiconductor device capable of suppressing oxidation of a semiconductor film lying under a refractory metal film in an electrode or wiring using the refractory metal film and a method for manufacturing the semiconductor device. Further, a method for manufacturing a semiconductor device in which selective oxidation for silicon can be safely effected and a semiconductor manufacturing system capable of safely effecting the selective oxidation for silicon without making the structure complicated and raising the cost are provided.

A second object of this invention is to provide a semiconductor device capable of suppressing impurity diffusion from a semiconductor film lying under a refractory metal film in an electrode or wiring using the refractory metal film and a method for manufacturing the semiconductor device.

The above objects can be attained by a semiconductor device according to a first aspect of this invention, comprising a semiconductor substrate; and a laminated film insulatively formed over the semiconductor substrate; wherein the laminated film includes a semiconductor film, a metal film of refractory metal formed on the semiconductor film, a conductive oxidation preventing film disposed between the metal film and the semiconductor film, for preventing oxidation of the semiconductor film in an interface between the metal film and the semiconductor film, and an oxide film formed on a side surface of the semiconductor film and formed to extend into upper and lower portions of the semiconductor film in a bird's beak form.

The semiconductor film is preferably formed of polysilicon.

The oxidation preventing film preferably contains refractory metal, silicon and at least one of nitrogen and carbon.

The refractory metal is preferably formed of metal in which a value obtained by subtracting an amount of drop in the Gibb's free energy caused when at least one of a nitride and a carbide of silicon is formed from an amount of drop in the Gibb's free energy caused when at least one of a nitride and a carbide of the refractory metal is formed is negative.

Further, the refractory metal is preferably formed of at least one selected from a group of Mo, W, Cr, Zn and Co.

A method for manufacturing the semiconductor device according to the first aspect comprises the steps of forming a silicon film on a substrate; forming a film containing refractory metal and at least one of nitrogen and carbon on the silicon film by using metal in which a value obtained by subtracting an amount of drop in the Gibb's free energy caused when at least one of a nitride and a carbide of silicon is formed from an amount of drop in the Gibb's free energy caused when at least one of a nitride and a carbide of the refractory metal is formed is negative as the refractory metal; changing the film into a metal film of the refractory metal by a heat treatment and forming a conductive oxidation preventing film containing the refractory metal, silicon and at least one of nitrogen and carbon on an interface between the metal film and the silicon film to form at least one of an electrode and a wiring including a laminated film of the metal film, oxidation preventing film and silicon film; and subjecting the substrate to an oxidation process.

Alternatively, a method for manufacturing the semiconductor device according to the first aspect may comprise the steps of forming a semiconductor film on a substrate; forming a conductive oxidation preventing film on the semiconductor film; forming a metal film of refractory metal on the oxidation preventing film; etching a laminated film of the metal film, oxidation preventing film and semiconductor film to form at least one of an electrode and wiring including the laminated film; and subjecting the substrate to an oxidation process. It is preferable that the oxidation preventing film contains refractory metal, silicon and at least one of nitrogen and carbon.

The step of subjecting the substrate to the oxidation process is preferably performed in an atmosphere including hydrogen and water.

The refractory metal is preferably formed of at least one selected from a group of Mo, W, Cr, Zn and Co.

According to the first aspect of this invention, since the electrode (wiring) with the structure in which the conductive oxidation preventing film is formed between the metal film of refractory metal and the semiconductor film is used, oxidation of the semiconductor film on the interface between the metal film and the semiconductor film in the post-oxidation process can be prevented and a rise in the contact resistance can be suppressed. Therefore, the advantage obtained by using refractory metal can be fully utilized and the RC delay can be suppressed even at the time of further miniaturization.

The oxide film extending into the upper and lower portions of the side surfaces of the semiconductor film in a bird's beak form is formed at the time of post-oxidation process, but substantially no rise in the contact resistance occurs unlike the case of oxidation of the semiconductor film on the interface between the metal film and the semiconductor film.

A semiconductor device according to a second aspect of this invention comprises a semiconductor region formed on a substrate; and an insulating film formed on the semiconductor region; a metal film of refractory metal formed on the insulating film, and a conductive oxidation preventing film disposed between the metal film and the insulating film, for preventing oxidation of the semiconductor region in an interface between the insulating film and the semiconductor region.

The semiconductor region is preferably formed of a semiconductor substrate.

The semiconductor region is formed of a semiconductor film disposed on a semiconductor substrate.

The semiconductor film is preferably formed of polysilicon.

The oxidation preventing film preferably contains refractory metal, silicon and at least one of nitrogen and carbon.

The refractory metal is preferably formed of metal in which a value obtained by subtracting an amount of drop in the Gibb's of a energy caused when at least one of a nitride and a carbide of silicon is formed from an amount of drop in the Gibb's free energy caused when at least one of a nitride and a carbide of the refractory metal is formed is negative.

Further, the refractory metal is preferably formed of at least one selected from a group of Mo, W, Cr, Zn and Co.

A method for manufacturing the semiconductor device according to the second aspect comprises the steps of forming an insulating film on the semiconductor region; forming a conductive oxidation preventing film on the insulating film; forming a metal film of refractory metal on the oxidation preventing film; etching a laminated film of the metal film and oxidation preventing film to form at least one of an electrode and a wiring including the laminated film; and subjecting the semiconductor region to an oxidation process.

It is preferable that the oxidation preventing film contains refractory metal, silicon and at least one of nitrogen and carbon.

The step of subjecting the substrate to the oxidation process is preferably performed in an atmosphere including hydrogen and water.

The refractory metal is preferably formed of at least one selected from a group of Mo, W, Cr, Zn and Co.

According to the second aspect of this invention, since the electrode (wiring) with the structure in which the conductive oxidation preventing film is formed under the metal film of refractory metal is used, oxidation of the semiconductor region under the electrode (wiring) in the post-oxidation process can be prevented and deterioration of the element characteristic due to an increase in the film thickness of the insulating film can be prevented. Therefore, the advantage obtained by using refractory metal can be fully utilized and the RC delay can be suppressed even at the time of further miniaturization.

Further, in the process of studies of a reaction preventing film disposed between the refractory metal film and the silicon film, the inventors found that a film formed of at least one of nitrogen and carbon, refractory metal and silicon had a function of preventing the reaction between the refractory metal film and the silicon film and a function of preventing the oxidant from being diffused into the silicon oxide film via the refractory metal film. Thus, in the case of a film (silicon film, silicon oxide film) containing silicon which is a ground film of a metal film formed of refractory metal, oxidation of the film containing silicon in the post-oxidation process and the reaction between the film and the metal film can be prevented.

Further, according to the studies by the inventors, it was found that an oxidation preventing film formed of refractory metal, nitrogen (carbon) and silicon could be easily formed if metal in which a value obtained by subtracting an amount of drop in the Gibb's free energy caused at the time of formation of silicon nitride (silicon carbide) from an amount of drop in the Gibb's free energy caused at the time of formation of the nitride (carbide) of the refractory metal is negative was used as the refractory metal. Specifically, it is preferable to use refractory metal formed of Mo, W, Cr, Zn or Co. Further, it was also found that oxygen might be contained in the oxidation preventing film by approximately 20% if the above condition was satisfied.

In the method for manufacturing the semiconductor device which safely effects the selective oxidation of silicon in this invention, it is preferable to set a to-be-processed body having a silicon exposing portion into a process chamber, introduce $H_2$ gas, $H_2O$ gas and non-oxidizing gas different from the $H_2$ gas into the process chamber, set the partial pressure of the $H_2$ gas in the process chamber to less than 4%, set the temperature of the to-be-processed body to 600° C. or more, and selectively oxidize the silicon exposing portion.

A semiconductor manufacturing system which safely effects the selective oxidation may comprise a process chamber for receiving a to-be-processed substrate for oxidation process; gas introducing means for introducing $H_2$ gas, $H_2O$ gas and non-oxidizing gas different from the $H_2$ gas into the process chamber; partial pressure control means for setting the partial pressure of the $H_2$ gas in the process chamber to less than 4%, and heating means for heating the to-be-processed substrate at temperatures of 600° C. or more.

The above method for manufacturing the semiconductor device and the semiconductor manufacturing system preferably have the following features.

(1) The oxidation process is effected while the pressure in the process chamber is maintained at a negative pressure with respect to the atmospheric pressure.

(2) The oxidation process is effected after the pressure in the process chamber is temporarily lowered to 1 Pa or less.

According to the method for manufacturing the semiconductor device of this invention, since the partial pressure of the $H_2$ gas is set to low pressure (low concentration) lower than the explosion limit with the body temperature set at 600° C. or more which is higher than the oxidation limit, the selective oxidation for silicon can be safely effected.

Further, according to the semiconductor manufacturing system of this invention, since the partial pressure of the $H_2$ gas can be set to low pressure (low concentration) lower than the explosion limit, the $H_2$ gas can be treated in the same manner as an inert gas. Therefore, the selective oxidation for silicon can be safely effected without making the device structure complicated and raising the cost.

A semiconductor device according to a third aspect of this invention comprises a first layer formed of at least polysilicon; a second layer formed on the first layer and formed of one of metal and metal silicide; and a third layer formed of an alloy containing at least tungsten, silicon and nitrogen, the third layer acting to suppress diffusion of impurity contained in the first layer into the second layer.

A method for manufacturing the semiconductor device according to the third aspect of this invention comprises a first step of depositing a polysilicon layer on a silicon substrate; a second step of forming an impurity diffusion suppressing layer formed of an alloy containing at least tungsten, silicon and nitrogen on the polysilicon layer, the impurity diffusion suppressing layer acting to suppress impurity diffusion from the polysilicon layer; a third step of forming one of a metal layer and metal silicide layer on the impurity diffusion suppressing layer; and a step of patterning a laminated structure obtained by at least the first to third steps.

According to the semiconductor device according to the third aspect of this invention and the method for manufacturing the same, since diffusion of impurity in the polysilicon layer into the metal layer or metal silicide layer can be suppressed in an electrode or wiring of the polycide or polymetal structure, a semiconductor device which is excellent in the electrical characteristics and is highly reliable and a method for manufacturing the same can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is an enlarged view of a region IV surrounded by broken lines in FIG. 3;

FIG. 5 is a cross sectional view showing a conventional gate electrode (polymetal gate);

FIG. 6 is a cross sectional view showing a semiconductor device for illustrating one example of a oxide film forming method;

FIG. 7 is a diagram showing the oxidation temperature dependency of the film thickness of an oxide film 21 (with $WN_x$) shown in FIG. 6 in comparison with the prior art (without $WN_x$);

FIGS. 13A to 13I are cross sectional views of a semiconductor device respectively showing the sequential steps of a method for forming a field effect transistor according to a sixth embodiment of this invention;

FIG. 18 is a characteristic diagram showing the relation between the oxidation temperature and the film thickness of the oxide film in the eighth embodiment;

FIG. 20 is a system diagram showing the schematic structure of a semiconductor manufacturing system according to a ninth embodiment of this invention;

FIG. 21 is a system diagram showing the schematic structure of a semiconductor manufacturing system according to a tenth embodiment of this invention;

FIG. 22 is a system diagram showing the schematic structure of a semiconductor manufacturing system according to an eleventh embodiment of this invention;

FIGS. 23A and 23B are diagrams showing the effect of suppressing diffusion of As in a twelfth embodiment of this invention and respectively showing cases wherein the annealing temperature is set at 800° C. and 950° C.;

FIGS. 24A and 24B are diagrams showing the effect of suppressing diffusion of B in a thirteenth embodiment of this invention and respectively showing cases wherein the annealing temperature is set at 800° C. and 950° C.;

FIGS. 26A and 26B are cross sectional views respectively showing the sequential steps of a method for forming a MOSFET for non-volatile memory according to a fifteenth embodiment of this invention;

FIG. 27 is a cross sectional view showing the structure of a MOSFET for non-volatile memory according to a sixteenth embodiment of this invention;

FIG. 28 is a cross sectional view showing the structure of a complementary MOSFET according to a seventeenth embodiment of this invention;

FIGS. 29A and 29B are cross sectional views of a conventional MOSFET, FIG. 29A showing a state before gate voltage application, and FIG. 29B showing a state in which a gate depletion is induced when the gate is biased to "OFF" side;

FIGS. 30A and 30B are a plan view and a cross sectional view of a conventional CMOSFET, respectively, FIG. 30B schematically showing a mutual diffusion of impurities in the CMOSFET;

FIGS. 31A to 31I are cross sectional views respectively showing the sequential steps of a method for forming a CMOSFET according to a seventeenth embodiment of this invention;

FIGS. 32A and 32B are diagrams showing a silicon substrate surface of the semiconductor device according to the first embodiment of this invention, FIG. 32A showing W4$f$ spectrum, and FIG. 32B showing Si2$p$ spectrum, respectively.

DETAILED DESCRIPTION OF THE PREFERRED EMBODIMENTS

There will now be described embodiments of this invention with reference to the accompanying drawings.

First Embodiment

The inventors made the following samples and evaluated them.

Figure 1A:
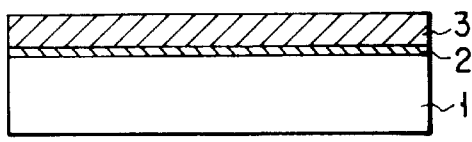
FIGS. 1A and 1B are cross sectional views of a semiconductor device respectively showing the sequential steps of a method for forming an oxide film according to a first embodiment of this invention.

First, as shown in FIG. 1A, a tungsten nitride film 2 (film thickness 5 nm) is deposited on a single crystal silicon substrate 1 by the reactive sputtering method using Ar and $N_2$ as the sputtering gas and using W as a target. Then, a tungsten film 3 (film thickness 100 nm) is deposited by the sputtering method.

Figure 1B:
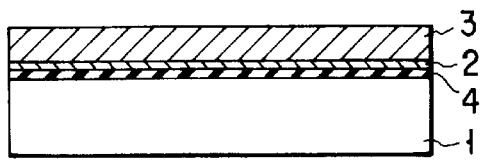

Next, as shown in FIG. 1B, the silicon substrate 1 is subjected to the oxidation process for 30 minutes in a temperature range of 1000° C. in the $N_2/H_2/H_2O$ atmosphere to form an oxide film 4 on the interface between the silicon substrate 1 and the tungsten nitride film 2. The partial pressure ratio in the oxidation atmosphere is set such that $P(N_2)/P(H_2)/P(H_2O)=0.9951/0.040/0.009$ [atm].

Finally, the tungsten film (W film) 3 and tungsten nitride film ($WN_x$ film) 2 are removed by use of a mixed solution of sulfuric acid and hydrogen peroxide.

The film thicknesses (oxide thicknesses) of the oxide film 4 of the thus obtained sample which lies directly under the W film 3/$WN_x$ film 2 at various oxidation temperatures were measured by the ellipsometry method.

Figure 2:
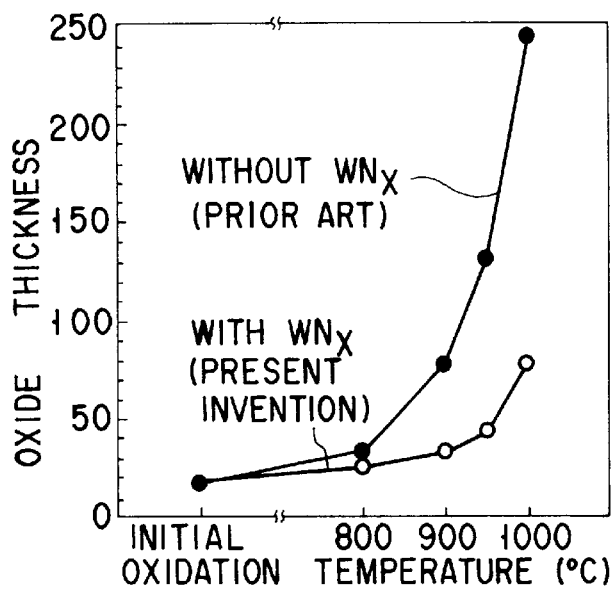
FIG. 2 is a diagram showing the oxidation temperature dependency of the film thickness of the oxide film 4 (with $WN_x$) shown in FIG. 1B in comparison with the prior art (without $WN_x$)

The result of the measurements (white dots in FIG. 2) is shown in FIG. 2. As a comparison example, the result of the measurements (black dots in FIG. 2) of the film thickness of an oxide film obtained by oxidizing a silicon substrate 1 having no W/$WN_x$ film formed on the surface thereof in the same condition is also shown. It is understood from FIG. 2 that the oxide film thickness in the sample having the W film 3/$WN_x$ film 2 can be made relatively small in comparison with the comparison example and substantially no oxidation occurs at 800° C.

As described before, it is reported that oxidation in the $H_2/H_2O$ atmosphere is applied to a W single-layered metal gate (J. Electrochem. Soc., Vol 135, pp 176 (1988)). According to the report by the reporter R. F. Kwasnick and others of the article, if a sample formed by forming a thin silicon oxide film on the silicon substrate and then forming a W film on the structure is used and is oxidized in the $H_2/H_2O$ atmosphere, the thickness of the thin silicon oxide film lying directly under the W film is increased. This comes from the fact that oxidants diffuse through the grain boundaries of the W film.

The difference of the above case from the experiments of the inventors of this invention is that the $WN_x$ film 2 is inserted between the W film 3 and the silicon substrate 1. The $WN_x$ film 2 is formed for the purpose of preventing the reaction between the W film 3 and the silicon substrate 1, but nitrogen in the $WN_x$ film 2 is almost entirely eliminated by the heat treatment at approximately 800° C. Therefore, the $WN_x$ film 2 becomes substantially equivalent to the W film after the heat treatment and the function thereof as the reaction preventing film is lowered.

In this case, the interface (W/Si interface) between the W film 3 and the silicon substrate 1 after the heat treatment was observed by the energy dispersive X-ray spectroscopy (EDX) method, and as a result, it was found that the $WN_x$ film 2 which was present immediately after deposition was changed into the W film and a WSiN film of extremely thin film thickness (approximately 10 angstrom) was formed on the W/Si interface.

The inventors believe that the WSiN film functions as a reaction preventing film for preventing the reaction between the W film 3 and the silicon substrate 1 (55th Symposium of Japan Applied Physics Society, 1994).

Further, a result of an EDX analysis taught that the construction of a WSiN layer is W:Si=1:5 to 6 and the thickness thereof is smaller than 1 nm. On the contrary, the ratio of W to N was W:N=1:1, for example.

Generally, when a titanium nitride film is deposited on a silicon substrate by a reactive sputtering method, the silicon substrate surface is nitrided by $N_2$ plasma discharge and a silicon nitride film is formed directly under the titanium nitride film during the deposition. The same phenomenon occurs in a case of a tungsten nitride film. Especially, in a case of a tungsten nitride film, a heating process at over 800° C. causes a dissociation of N atoms in the film, even in a nitrogen atmosphere, to make the film a tungsten film. Therefore, it is considered that the barrier layer may really be a SiN layer by plasma nitriding, not a WSiN layer.

Considering the above possibility, an X-ray photoelectron spectroscopy (XPS) analysis was performed to a surface of a silicon substrate, which was obtained from the following process. That is, a laminated layer of a tungsten layer/a tungsten nitride layer/a silicon substrate was heat-treated at 800° C., 30 minutes, in a nitrogen atmosphere, and then the tungsten layer and the tungsten nitride layer were removed by a mixed solution of sulfuric acid and hydrogen peroxide. FIGS. 32A and 32B show the narrow spectra of Wf4 and Si2$p$, respectively, the dotted lines showing the spectra obtained from the specimen before the heat treatment, and the solid lines showing that after the heat treatment. Tungsten of approximately 2% was detected from the surface of either specimen, but a significant difference was observed between the binding states thereof.

Firstly, the spectrum of W4$f$ before the heat treatment has a broad peak wherein W—O bonds (peaks at 36 eV and 38 eV) and metallic bonds (peaks at 31 eV and 33 eV) are included, while that after the heat-treatment shows the peaks of the metallic bonds clearly. These peaks of the metallic bonds are possibly W—W bonds or W—Si bonds. The EDX analysis result aforementioned showed that the composition of WSiN layer is Si-rich so that these metallic bonds are considered as W—Si bonds.

Secondly, the spectrum of Si2p before the heat treatment has a broad peak including Si—O bonds (a peak at 103.7 eV), except for Si—Si bonds of the substrate (a peak at 99.6 eV), while that after the heat treatment has a sharp peak of Si—N bonds (a peak at 102 eV).

As a conclusion, a WSiN layer is formed not by plasma nitriding during the deposition of a tungsten nitride layer, but by a re-distribution of nitrogen atoms in the tungsten nitride layer during the heat treatment.

As described above, it is considered that the WSiN film on the W/Si interface is formed by re-distribution of nitrogen in the $WN_x$ film 2. The mechanism can be summarized as follows.

An amount of drop in the Gibb's free energy caused when tungsten nitride is formed from tungsten is smaller than that caused when silicon nitride is formed from silicon. Therefore, the chemical potential of nitrogen is smaller on the silicon substrate 1 side in a state in which the $WN_x$ film 2 and the silicon substrate 1 are formed in contact with each other. As a result, nitrogen in the $WN_x$ film 2 moves towards the silicon substrate 1 side (out diffusion). Thus, nitrogen in the $WN_x$ film 2 is segregated and collected on the W/Si interface to form the WSiN film.

Nitrogen segregated on the interface is coupled to free bonds of silicon (dangling bonds), thereby forming an Si—N bound layer. A concentration of nitrogen and silicon was approximately over $5 \times 10^{17}/cm^2$. This is considered to prevent the atoms from coming and going between the tungsten and silicon layers. In this case, it is important for nitrogen to be able to move comparably freely. If nitrogen contained in metal is strongly bound thereto, it can not be diffused to the interface to be segregated as above-mentioned.

Therefore, the above condition must be considered if a WSiN film is directly formed by a deposition method, instead of by redistribution of nitrogen as above-mentioned. The reason is that nitrogen contained in a WSiN film has a Si—N bond and can not move freely, unlike the case in a tungsten nitride film, thereby prevented from re-distributing on the interface between the tungsten and silicon layers.

In the case of WSiN film directly formed by deposition, a redistribution of nitrogen on the interface of the tungsten and silicon layer can not be expected, while a diffusion of oxygen in the film must be prevented. Therefore, the concentration of nitrogen and silicon must be approximately over $5 \times 10^{17}/cm^2$.

It is considered that oxidation of the W/Si interface is controlled at the same time of reaction prevention because the WSiN film functions to prevent diffusion of oxidant. This is considered because the coupling force between Si and N is stronger than that between Si and O and it is difficult to replace nitrogen by oxygen.

It is understood from the above results that not only the reaction between the W film 3 and the silicon substrate 1 can be prevented by using the structure having the WSiN film inserted therein but also oxidation of the silicon substrate 1 on the interface between the W film 3 and the silicon substrate 1 can be suppressed.

Second Embodiment

FIGS. 3A to 3E are cross sectional views respectively showing the sequential steps of a method for forming a gate electrode (polymetal gate) according to a second embodiment of this invention.

Figure 3A:
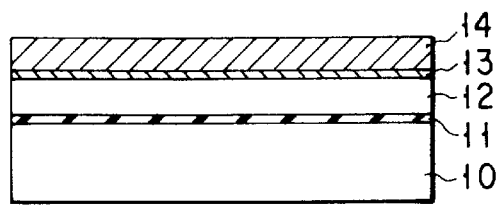
FIGS. 3A to 3E are cross sectional views of a semiconductor device respectively showing the sequential steps of a method for forming a gate electrode (polymetal gate) according to a second embodiment of this invention.

First, as shown in FIG. 3A, a thin silicon oxide film 11 (film thickness 5 nm) is formed as a gate oxide film on a single crystal silicon substrate 10 and a polysilicon film 12 (film thickness 100 nm) is deposited on the silicon film by the chemical vapor deposition (CVD) method.

Then, a tungsten nitride film 13 (film thickness 5 nm) is formed on the polysilicon film 12 by the reactive sputtering method and a tungsten film 14 (film thickness 100 nm) is formed on the tungsten nitride film by the sputtering method.

Figure 3B:
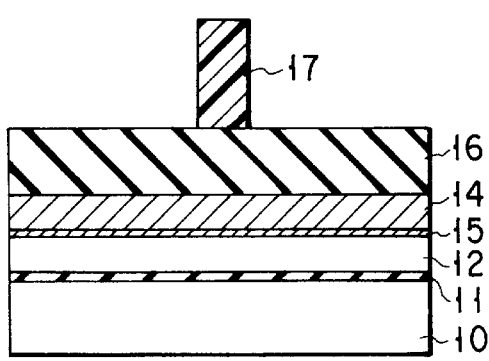

Next, as shown in FIG. 3B, the heat treatment at approximately 800° C. is effected to outwardly diffuse nitrogen in the tungsten nitride film 13 so as to form an extremely thin WSiN film 15 on the interface between the tungsten film 14 and the polysilicon film 12. At this time, the tungsten nitride film 13 is changed into a tungsten film and integrated with the tungsten film 14. Then, a silicon nitride film 16 (film thickness 200 nm) is deposited on the tungsten film 14 by the CVD method. The above heat treatment can also be effected as part of the film forming step for the silicon nitride film 16 in which the film forming temperature is set at approximately 800° C.

Further, a photoresist (film thickness 1 μm) is coated on the silicon nitride film 16 by the spin coating method, and the photoresist is exposed via a photomask and developed to form a photoresist pattern 17 with 0.25 μm width, for example.

Figure 3C:
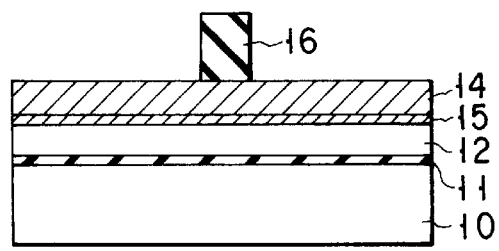

Next, as shown in FIG. 3C, the silicon nitride film 16 is etched along the photoresist pattern 17 by use of a dry etching device and then the remaining photoresist pattern 17 is removed by $O_2$ ashing.

Figure 3D:
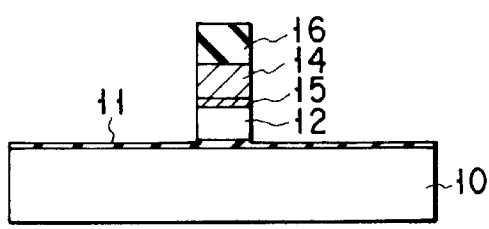

Then, as shown in FIG. 3D, the tungsten film 14, WSiN film 15 and polysilicon film 12 are etched with the silicon nitride film 16 used as an etching mask.

Figure 3E:
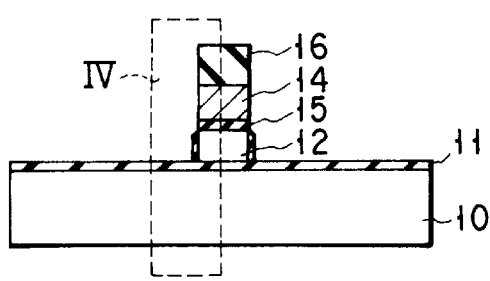

Next, as shown in FIG. 3E, selective oxidation (post-oxidation) for silicon is effected in the $N_2/H_2/H_2O$ atmosphere to restore the gate oxide film 11 which is partly removed at the time of etching of the polysilicon film 12 and round the corner portion of the polysilicon film 12. The condition of oxidation is that the partial pressure ratio $P(N_2)/P(H_2)/P(H_2O)$ is 0.9951/0.040/0.009 [atm], the oxidation temperature is 800° C., and the oxidation time is 30 minutes, for example.

By the above selective oxidation, the gate oxide film 11 is restored to the original film thickness and the corner portions 18 of the polysilicon film 12 (gate portion) are rounded as shown in the enlarged view of FIG. 4. As a result, concentration of the electric field in the corner portion 18 of the gate electrode can be avoided and the reliability of the gate oxide film 11 is enhanced.

At this time, as shown in FIG. 4, an oxidant 20 is injected into the substrate or polysilicon film 12 in directions indicated by arrows, but since the WSiN film 15 lying between the tungsten film 14 and the polysilicon film 12 prevents diffusion of the oxidant 20, the oxidant 20 cannot enter from the upper surface of the silicon film 12 via the tungsten film 14.

Therefore, since the polysilicon film 12 in the interface between the tungsten film 14 and the polysilicon film 12 is scarcely oxidized, the contact resistance can be prevented from being increased and the RC delay time can be reduced.

Since the oxidant 20 can be diffused from the side surface of the polysilicon film 12, a silicon oxide film 19 is selectively formed on the side surface of the polysilicon film 12. The silicon oxide film 19 is formed to extend into the upper and lower portions of the side surface of the polysilicon film 12 towards the center thereof in a bird's beak form. The silicon oxide film 19 does not cause a problem such as the RC delay.

FIG. 5 shows a cross section of a conventional gate portion in which the WSiN film 15 is not formed. As is understood from FIG. 5, since the oxidant 20 enters from the tungsten film 14 side, the polysilicon film 12 on the interface between the tungsten film 14 and the polysilicon film 12 is also oxidized. As a result, a silicon oxide film 19 is formed not only on the side surface of the polysilicon film 12 but also on the above interface. Therefore, the contact resistance between the tungsten film 14 and the polysilicon film 12 is increased and the RC delay is increased.

According to the above embodiment, by inserting the WSiN film 15 as the oxidation preventing layer between the tungsten film 14 and the polysilicon film 12, the gate oxide film 12 can be restored by selective oxidation of silicon without increasing the contact resistance between the tungsten film 14 and the polysilicon film 12 even if the selective oxidation (post-oxidation) is effected in the $N_2/H_2O/H_2O$ atmosphere. Further, since the WSiN film 15 also functions as a reaction preventing film, reaction between the tungsten film 14 and the polysilicon film 12 can also be prevented.

Thus, the advantage obtained by using the tungsten film 14 which is refractory metal can be fully utilized and a high-speed MOS transistor whose operation speed is not limited by the RC delay can be obtained even in the generation of the gate length 0.25 $\mu$m and in the succeeding generations.

Further, in the above embodiment, a method for effecting the heat treatment after the tungsten nitride film 13 is formed by the reactive sputtering method is explained as the method for forming the WSiN film 15, but it is possible to form the WSiN film by the reactive sputtering method in the initial stage.

For example, the WSiN film 15 can be formed by effecting the reactive sputtering method using Ar gas and $N_2$ gas as the sputtering gas and using $WSi_x$ as a target.

Further, the film forming method is not limited to the sputtering method and, for example, the WSiN film 15 may be formed by the CVD method. For example, the WSiN film 15 can be formed by using a mixture of a gas selected from $WF_6$, $WCl_6$, $WCl_4$ and $W(CO)_6$ as a source gas of W, a gas selected from $SiH_4$ and $SiH_2Cl_2$ as a source gas of Si, and a gas selected from NH3 and N2 as a source gas of N.

Next, an explanation will be given concerning the case where a titanium nitride film is used instead of WSiN film as a comparison.

Figure 33A:
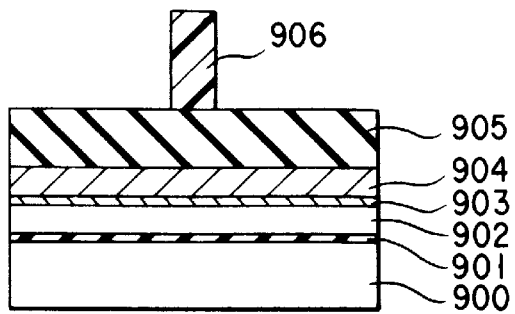
FIGS. 33A to 33E are cross sectional views of a conventional semiconductor device respectively showing the sequential steps of a method for forming a gate electrode using titanium nitride as a barrier layer.

First, as shown in FIG. 33A, a thin silicon oxide film 901 (film thickness 5 nm) is deposited on a single crystal silicon substrate 900 by the thermal oxidation method. A polysilicon layer 902 (film thickness 100 nm) is formed thereon by the chemical vapor deposition (CVD) method.

Subsequently, a titanium nitride layer 903 (film thickness 10 nm) is deposited thereon by the reactive sputtering method, using Ti as a target and Ar and $N_2$ as sputtering gas. A tungsten layer 904 (film thickness 100 nm) is deposited thereon by the sputtering method.

After that, a silicon nitride layer 905 (thickness of 200 nm) is deposited thereon by the CVD method, and then a photoresist is coated to a thickness of about 1 $\mu$m by the spin coating method to be exposed and developed, thereby forming a resist pattern 906 of 0.15 $\mu$m width.

Figure 33B:
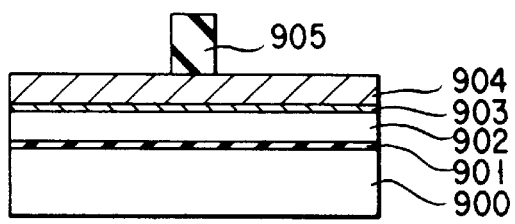

Next, as shown in FIG. 33B, using the resist pattern 906 as an etching mask, the silicon nitride film 905 is etched. The resist pattern 906 is removed by oxygen plasma ashing to form a mask pattern 905 made of a silicon nitride film.

Figure 33C:
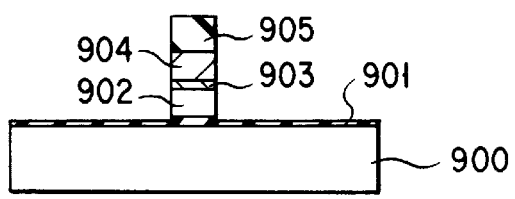

After that, as shown in FIG. 33C, using the silicon nitride film 905 as an etching mask, etching is performed to the tungsten layer 904, the titanium nitride layer 903, and the polycrystal silicon layer 902.

Figure 33D:
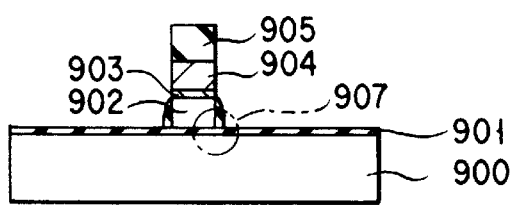

After that, as shown in FIG. 33D, a selective oxidation of silicon is performed in an atmosphere of $N_2/H_2/H_2O$, to restore a gate oxide thickness which is reduced during the electrode formation, and to round the corner 907 of the polysilicon layer 902. In this atmosphere, side walls of the silicon substrate and the polysilicon layer can be oxidized without the tungsten layer oxidized.

However, an amount of drop in the Gibbs free energy caused when titanium is oxidized is smaller than that caused when silicon is oxidized. Therefore, it is thermodynamically impossible to selectively oxidize a silicon layer without oxidation of a titanium nitride layer containing titanium atoms.

Figure 33E:
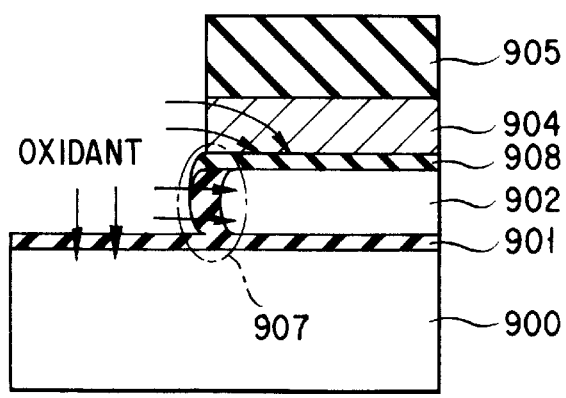

As shown in FIG. 33E, oxidants are diffused into the tungsten layer 904 as well, with the result that not only the side wall of the titanium nitride layer 903 but also the interface between the titanium nitride layer 903 and the tungsten layer 904 is oxidized, even if the titanium nitride layer 903 is sandwiched in a laminated structure.

Therefore, in the above oxidation step, a titanium oxide layer 908, which is an insulator, is formed between the refractory metal layer and the polycrystal silicon layer, thereby significantly increasing the contact resistance of the interface. In the worst case, a volume expansion caused by the titanium oxide layer formation results in separation of the refractory metal layer, whereby the stacked structure no longer works as an electrode.

Generally, a titanium nitride layer is used for a reaction preventing layer between metal and silicon, so called barrier metal. However, it can not be used for a semiconductor device, which requires the above oxidation step.

Therefore, the refractory metal used for the barrier metal must be one in which a value obtained by subtracting an amount of drop in the Gibbs free energy caused when a silicon oxide is formed from an amount of drop in the Gibbs free energy caused when an oxide of the refractory metal is formed is negative.

Third Embodiment

The inventors made the following samples and evaluated them.

That is, as shown in FIG. 6, a thin silicon oxide film 21 (film thickness 10 nm) is formed on a single crystal silicon substrate 20a and a tungsten nitride film 22 (film thickness 5 nm) is deposited on the structure by the reactive sputtering method. Then, a tungsten film 23 (film thickness 100 nm) is deposited by the sputtering method.

Next, the silicon substrate 20a is subjected to the oxidation process for 30 minutes in a temperature range of 800 to 1000° C. in the $N_2/H_2/H_2O$ atmosphere. The partial pressure ratio in the oxidation atmosphere is set such that $P(N_2)/P(H_2)/P(H_2O)=0.9951/0.040/0.009$ [atm].

Finally, the tungsten film 23 and tungsten nitride film 22 are removed by use of a mixed solution of sulfuric acid and hydrogen peroxide.

The film thicknesses of the silicon oxide film ($SiO_2$ film) 21 which lies directly under a laminated film (W film 23/$WN_x$ film 22) of the tungsten film 23 and the tungsten nitride film 22 at various oxidation temperatures were measured by the ellipsometry method.

The result of the measurements (white dots in FIG. 7) is shown in FIG. 7. As a comparison example, the result of the measurements (black dots in FIG. 7) of the film thickness of an oxide film 21 under a W film obtained by oxidizing a silicon substrate 1 having no $WN_x$ film formed between the W film 22 and the silicon oxide film 21 in the same condition is also shown.

It is understood from FIG. 7 that the film thickness of the oxide film 21 under the W film 23 or the W film 23/$WN_x$ film 22 increases irrespective of the presence or absence of the $WN_x$ film 22 with a rise in oxidation temperature and the tendency is the same irrespective of the presence or absence of the $WN_x$ film 22.

The interfaces of the W film 23/$WN_x$ film 22/$SiO_2$ film 21 after oxidation were subjected to the elementary analysis by the EDX method, and as a result, it was found that the concentration of nitrogen in the interface was low and the WSiN film was not formed.

The above result can be explained based on the re-distribution of nitrogen described before.

That is, it is considered that a WSiN film is not formed on the $SiO_2$ film 21 and diffusion of the oxidant cannot be suppressed since an amount of drop in the Gibb's free energy caused when tungsten nitride is formed from tungsten is smaller than that caused when silicon nitride is formed from silicon but is larger than that caused when silicon nitride is formed from silicon oxide.

Figure 8:
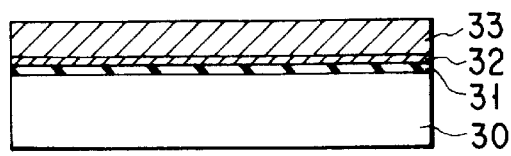
FIG. 8 is a cross sectional view of a semiconductor device for illustrating a method for forming an oxide film according to a third embodiment of this invention.

Based on the above fact, a sample shown in FIG. 8 was made. That is, another sample was made by forming a thin silicon oxide film (film thickness 10 nm) on a silicon substrate 30, forming a WSiN film 32 (film thickness 1 nm) on the silicon oxide film by the reactive sputtering method, and then forming a W film 33 (film thickness 100 nm) on the WSiN film by the sputtering method.

Next, the sample was subjected to the oxidation process for 30 minutes in a temperature range of 800 to 1000° C. in the $N_2/H_2/H_2O$ atmosphere. The partial pressure ratio was set to the same value as described before.

Then, like the case of the sample of FIG. 6, the film thicknesses of the silicon oxide film 31 at the oxidation temperatures of the above sample were checked.

Figure 9:
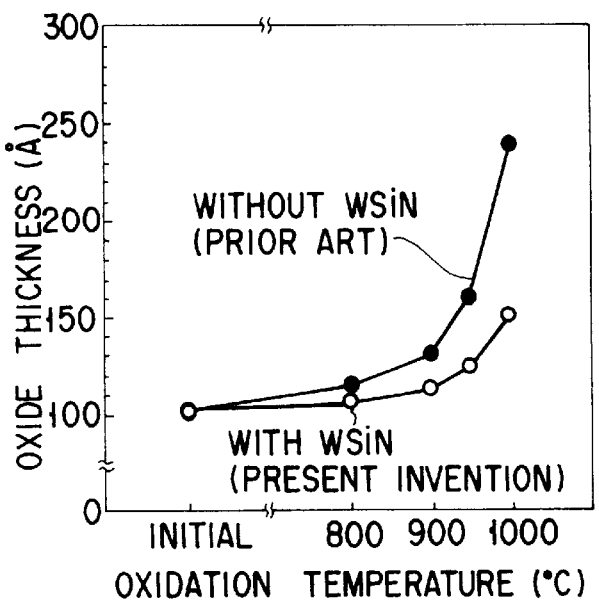
FIG. 9 is a diagram showing the oxidation temperature dependency of the film thickness of an oxide film 31 (with WSiN) shown in FIG. 8 in comparison with the prior art (without WSiN)

The result of the measurements is shown in FIG. 9 by use of white dots. As a comparison example, the result of measurements of the film thickness of an oxide film 31 under a W film 33 obtained by oxidizing a silicon substrate 30 having no WSiN film 32 formed on the surface thereof in the same condition is also shown by use of black dots.

It is understood from FIG. 9 that an increase in the film thickness of the silicon oxide film 31 in the sample having the WSiN film 32/W film 33 formed therein is significantly suppressed in comparison with the comparison example. That is, the diffusion preventing function can be supplemented by forming the WSiN film 32.

As the above result, it is understood that the WSiN film 32 is significantly effective as an oxidation preventing film and an increase in the film thickness of the silicon oxide film 31 due to post-oxidation can be effectively prevented by utilizing the structure having the WSiN film inserted between the W film 33 and the thin silicon oxide film 31.

Fourth Embodiment

FIGS. 10A to 10D are cross sectional views respectively showing the sequential steps of a method for forming a gate electrode (metal gate) according to a fourth embodiment of this invention.

Figure 10A:
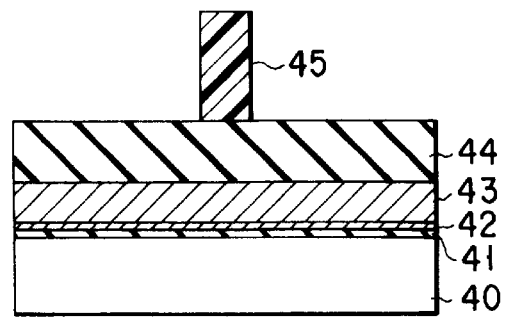
FIGS. 10A to 10D are cross sectional views of a device respectively showing the sequential steps of a method for forming a gate electrode (metal gate) according to a fourth embodiment of this invention.

First, as shown in FIG. 10A, a thin silicon oxide film 41 (film thickness 4 nm) is formed as a gate oxide film on a single crystal silicon substrate 40 and a WSiN film 42 (film thickness 1 nm) is deposited on the silicon oxide film by the reactive sputtering method.

Then, a tungsten film 43 (film thickness 100 nm) is deposited on the WSiN film 42 by the sputtering method and a silicon nitride film 44 (film thickness 200 nm) is deposited on the tungsten film by the CVD method.

Further, a photoresist (film thickness 1 $\mu$m) is coated on the silicon nitride film 44 by the spin coating method, and the photoresist is exposed via a photomask and developed to form a photoresist pattern 45 with 0.15 $\mu$m width, for example.

Figure 10B:
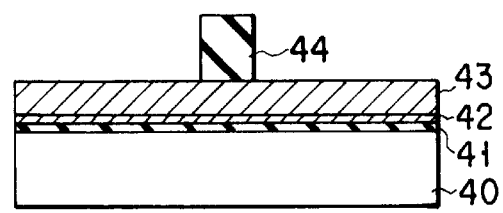

Next, as shown in FIG. 10B, the silicon nitride film 44 is etched along the photoresist pattern 45 by use of a dry etching device and then the remaining photoresist pattern 45 is removed by $O_2$ ashing.

Figure 10C:
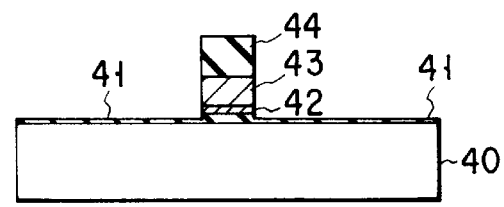

Then, as shown in FIG. 10C, the tungsten film 43 and WSiN film 42 are etched with the silicon nitride film 44 used as an etching mask.

Figure 10D:
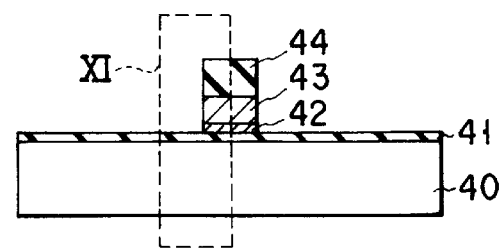

Next, as shown in FIG. 10D, selective oxidation (post-oxidation) for silicon is effected in the $N_2/H_2/H_2O$ atmosphere to restore that thin silicon oxide film 41 other than the gate portion which is partly removed at the time of etching of the tungsten film 43 and WSiN film 42.

The condition of oxidation is that the partial pressure ratio $P(N_2)/P(H_2)/P(H_2O)$ is 0.9951/0.040/0.009 [atm], the oxidation temperature is 800° C., and the oxidation time is 30 minutes, for example.

At this time, since the WSiN film 42 lying between the tungsten film 43 and the thin silicon oxide film 41 prevents diffusion of the oxidant, the oxidant cannot enter from the tungsten film 43 side. Therefore, part of the silicon oxide film 41 which is a gate oxide film lying below the tungsten film 43 is scarcely oxidized and the film thickness is not increased so that a lowering in the driving ability due to an increase in the film thickness of the gate oxide film will not occur.

Figure 11:
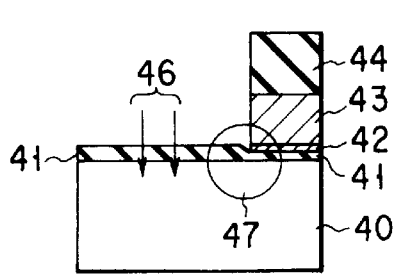
FIG. 11 is an enlarged view of a region XI surrounded by broken lines in FIG. 10D.

Further, as shown in FIG. 11, since the oxidant 40 is diffused via the side surface of the silicon oxide film 41 lying below the tungsten film 43, the silicon oxide film 41 extends towards the center of the gate portion in a bird's beak form in a portion 47 lying under the gate edge of the silicon oxide film 41, but no characteristic problem occurs.

Fifth Embodiment

FIGS. 12A to 12D are cross sectional views respectively showing the sequential steps of a method for forming a gate electrode (polymetal gate) according to a fifth embodiment of this invention.

The main difference of this embodiment from the first to fourth embodiments is that carbon is used instead of nitrogen which is one material of the oxidation preventing film. That is, the oxidation preventing film according to this embodiment is formed of carbon, silicon and refractory metal.

Figure 12A:
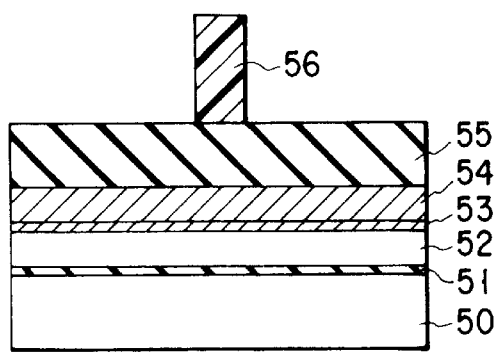
FIGS. 12A to 12D are cross sectional views of a semiconductor device respectively showing the sequential steps of a method for forming a gate electrode (polymetal gate) according to a fifth embodiment of this invention.

First, as shown in FIG. 12A, a thin silicon oxide film 51 (film thickness 5 nm) is formed as a gate oxide film on a single crystal silicon substrate 50 and a polysilicon film 52 (film thickness 100 nm) is deposited on the silicon oxide film by the CVD method.

After this, a WSiC film 53 (film thickness 2 nm) is formed on the polysilicon film 52 by effecting the reactive sputtering method using Ar gas and $CH_4$ gas as the sputtering gas and using, e.g., $WSi_x$ as a target, and then, a tungsten film 54 (film thickness 100 nm) is deposited on the WSiC film by the sputtering method and a silicon nitride film 55 (film thickness 200 nm) is deposited on the tungsten film by the CVD method.

Further, a photoresist (film thickness 1 $\mu$m) is coated on the silicon nitride film 55 by the spin coating method, and the photoresist is exposed via a photomask and developed to form a photoresist pattern 56 with 0.25 μm width, for example.

Figure 12B:
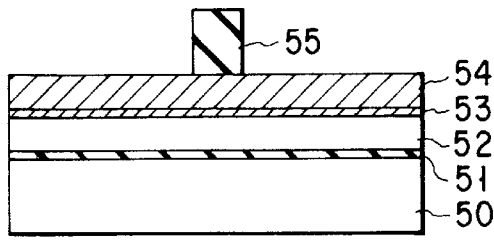

Next, as shown in FIG. 12B, the silicon nitride film 55 is etched along the photoresist pattern 56 by use of a dry etching device and then the remaining photoresist pattern 56 is removed by $O_2$ ashing.

Figure 12C:
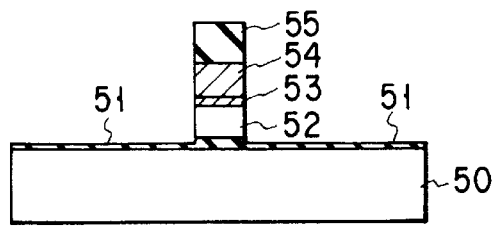

Then, as shown in FIG. 12C, the tungsten film 54, WSiC film 53 and polysilicon film 52 are etched with the silicon nitride film 55 used as an etching mask.

Figure 12D:
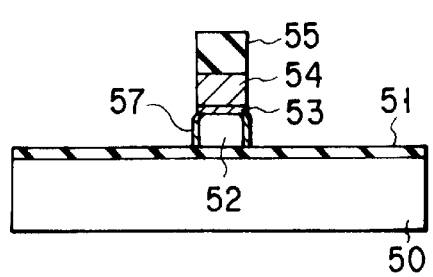

Next, as shown in FIG. 12D, selective oxidation (post-oxidation) for silicon is effected in the $N_2/H_2/H_2O$ atmosphere to restore the gate oxide film 51 which is partly removed at the time of etching of the polysilicon film 52 and oxidize the corner portions of the polysilicon film 52.

The condition of oxidation is that the partial pressure ratio $P(N_2)/P(H_2)/P(H_2O)$ is 0.9951/0.040/0.009 [atm], the oxidation temperature is 800° C., and the oxidation time is 30 minutes, for example.

By the above selective oxidation, the gate oxide film 51 is restored to the original film thickness and the corner portions of the polysilicon film are rounded by the oxide film 57. As a result, concentration of the electric field in the corner portions of the gate electrode can be avoided and the reliability of the gate oxide film 51 is enhanced.

At this time, like the case of the first embodiment, since the WSiC film 53 lying between the tungsten film 54 and the polysilicon film 52 prevents diffusion of the oxidant, the oxidant cannot enter from the tungsten film 54 side.

Therefore, since the polysilicon film 52 in the interface between the tungsten film 54 and the polysilicon film 52 is scarcely oxidized, the contact resistance can be prevented from being increased and the RC delay time can be reduced. Further, the same effect as that of the first embodiment can be attained.

Since the oxidant can be diffused via the side wall of the polysilicon film 52, the silicon oxide film 57 is selectively formed on the side surface of the polysilicon film 52. The silicon oxide film 57 is formed to extend into the upper and lower portions of the side surface of the polysilicon film 52 towards the center thereof in a bird's beak form.

In this embodiment, as a method for forming the WSiC layer, the reactive sputtering method using $WSi_x$ as a target is selected, but it is possible to form a tungsten carbide (WC) film by the sputtering method using Ar gas and $CH_4$ gas as the sputtering gas and then form the WSiC film 53 by effecting the heat treatment.

Further, the film forming method is not limited to the sputtering method and the WSiC layer 53 can be formed by the CVD method. For example, it is possible to form the WSiC film 53 by using $WF_6$, $SiH_4$ and $CH_4$ gas.

Furthermore, in the reactive sputtering method and CVD method, $CH_4$ gas is selected as a carbon-based gas, but $C_2H_6$, $C_3H_8$, $C_2H_2$ and the like may be used.

Sixth Embodiment

FIGS. 13A to 13I are cross sectional views respectively showing the sequential steps of a method for forming a field effect transistor (MOSFET) according to a sixth embodiment of this invention.

Figure 13A:
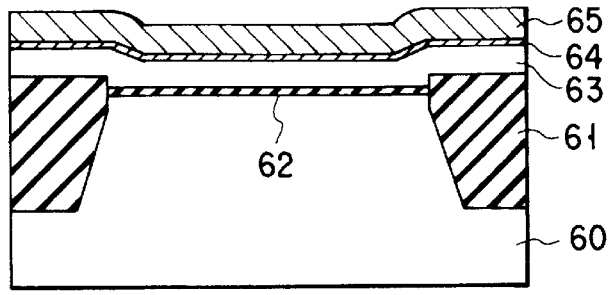

First, as shown in FIG. 13A, an element isolation insulating film 61 is formed for element isolation on the surface of a single crystal silicon substrate 60. Then, after a gate oxide film 62 (film thickness 5 nm) is formed on the surface of part of the silicon substrate 60 which is surrounded by the element isolation insulating film 61, a polysilicon film 63 (film thickness 100 nm) is formed on the structure by the CVD method.

After this, a tungsten nitride film 64 (film thickness 5 nm) is formed on the polysilicon film 63 by effecting the reactive sputtering method, and then, a tungsten film 65 (film thickness 100 nm) is formed on the tungsten nitride film 64 by the reactive sputtering method.

Figure 13B:
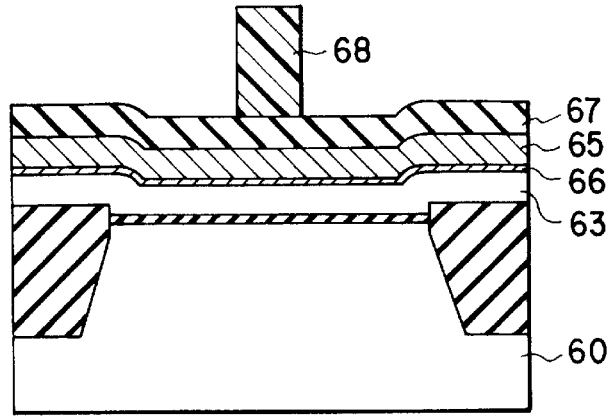

Next, as shown in FIG. 13B, an extremely thin WSiN layer 66 is formed on the interface between the tungsten film 65 and the polysilicon film 63 by effecting the heat treatment at approximately 800° C. Then, a silicon nitride film 67 (film thickness 200 nm) is formed on the tungsten film 65 by the CVD method. In this case, since the temperature for film formation of the silicon nitride film 67 is approximately 800° C., the above heat treatment may be effected in the film forming process without previously effecting the above heat treatment.

Further, a photoresist (film thickness 1 μm) is coated on the silicon nitride film 67 by the spin coating method, and the photoresist is exposed via a photomask and developed to form a resist pattern 68 with 0.25 μm width, for example.

Figure 13C:
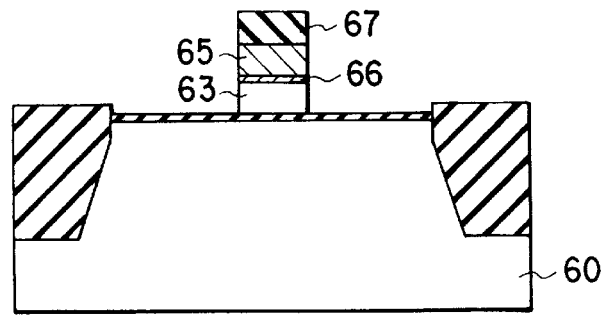

Next, as shown in FIG. 13C, the silicon nitride film 67 is etched along the resist pattern 68 by use of a dry etching device. After this, the remaining resist pattern 68 is removed by $O_2$ ashing.

Then, as shown in FIG. 13C, the tungsten film 65, WSiN layer 66 and polysilicon film 63 are sequentially etched with the silicon nitride film 67 used as an etching mask.

Figure 13D:
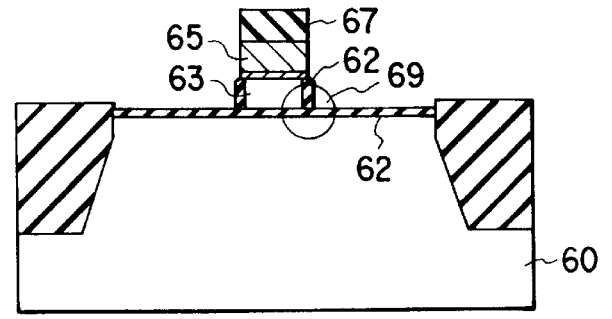

Next, as shown in FIG. 13D, selective oxidation for silicon is effected in the $N_2/H_2/H_2O$ atmosphere in a temperature range of 700 to 900° C. while controlling the partial pressures of the gases to restore the film thickness of the thin gate oxide film 62 which is partly removed at the time of etching of the polysilicon film 63 and round the corner portions 69 of the bottom portion of the polysilicon film 63. By the selective oxidation, since only silicon is oxidized and the corner portion 69 is rounded, a lowering in the reliability of the MOSFET due to concentration of the electric field in the corner portion can be prevented.

It was confirmed that an oxide film formed or grown near the interface between the polysilicon film 63 and the tungsten film 65 after the above oxidation was not observed and the WSiN layer 66 prevented the inward diffusion of the oxidant from the external atmosphere.

The same effect was recognized not only in the $N_2/H_2/H_2O$ atmosphere, but also in an atmosphere of a small amount of oxygen, a mixed gas atmosphere of $O_2$ and $H_2$ or a small amount of water vapor or a mixed gas atmosphere of CO and $CO_2$.

Figure 13E:
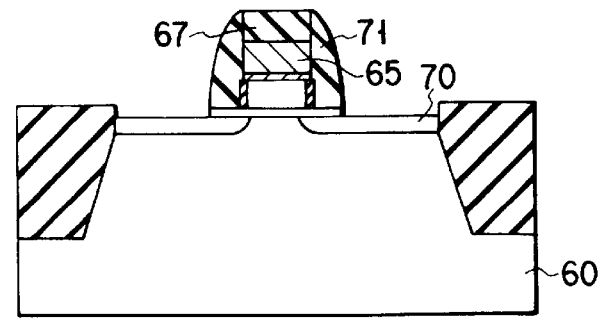

Next, as shown in FIG. 13E, after a shallow impurity diffusion layer (source/drain diffusion layer) 70 is formed by ion-implantation or the like, a silicon nitride film 71 is formed as a side wall insulating film. As a result, the tungsten film 65 is surrounded by the silicon nitride films 67 and 71 so that the tungsten film 65 will not be oxidized even if the structure is placed in the oxidation atmosphere, for example. Further, the tungsten film 65 is a material soluble in a solution such as a hydrogen peroxide solution but entrance of the solution can be prevented by use of the above structure.

After this, as shown in FIG. 13F, after a deep impurity diffusion layer (source/drain diffusion layer) 72 is formed by ion-implantation or the like, a metal silicide layer 73 is formed on the impurity diffusion layer 72.

Next, as shown in FIG. 13G, an inter-level insulating film 74 is formed on the entire surface and then the surface of the inter-level insulating film 74 is made flat by the chemical mechanical polishing (CMP) method or the like. After this, a photoresist (film thickness 1 μm) is coated on the inter-level insulating film 74 by the spin coating method and the photoresist is exposed via a photomask and developed to form a resist pattern 75 with 0.3 μm hole diameter, for example.

Next, as shown in FIG. 13H, the inter-level insulating film 74 is etched by use of a dry etching device with the resist pattern 75 used as an etching mask so as to form a contact hole and then the resist pattern 75 is removed. At this time, the etching condition is that the power density is 2.0 W/cm², the pressure is 40 mTorr, and the flow rate is $C_4F_8/CO/Ar=$ 10/100/200 SCCM.

In this case, since the inter-level insulating layer 74 is etched at the rate of approximately 400 nm/min and the silicon nitride films 67 and 71 are etched at the rate of approximately 10 nm/min, the selective ratio of the inter-level insulating layer 74 to the silicon nitride films 67 and 71 is approximately 40.

Therefore, even if part of the hole is formed to extend over the gate electrode of the laminated structure of the tungsten film 65, WSiN film 66 and polysilicon film 63 in the process of forming the resist pattern 75, the silicon nitride films 67 and 71 are not etched so that the contact hole for the impurity diffusion layer 72 can be formed without exposing the gate electrode. Therefore, the margin of the positioning accuracy of the resist pattern 75 can be enlarged.

Next, as shown in FIG. 13I, a tungsten film 77 is selectively formed in the contact hole by use of the film forming method such as the selective CVD method. At this time, since the silicon nitride films 67, 71 cover the gate electrode, there occurs no possibility that the impurity diffusion layer 72 will be made in electrical contact with the gate electrode to cause a leak current.

As described before, according to this embodiment, since the structure having the gate electrode 76 surrounded by the silicon nitride films 67 and 71 is used, no leak current will flow between the impurity diffusion layer 72 and the gate electrode 76 even if the position of the resist pattern 75 is deviated towards the gate electrode 76 side, and the margin of the alignment of the resist pattern 75 can be enlarged.

Since, in the conventional MOSFET, deterioration in the transistor characteristic caused by positional deviation of the resist pattern 75 is prevented by enlarging the width of the impurity diffusion layer 72 and setting the position of the resist pattern 75 at the longest possible distance from the gate electrode 76, the size of the MOSFET is inevitably increased. That is, by using the structure having the gate electrode 76 surrounded by the silicon nitride films 67 and 71 as in this embodiment, the element size can be reduced in comparison with the conventional case.

Seventh Embodiment

FIGS. 14A to 14D are cross sectional views respectively showing the sequential steps of a method for forming a field effect transistor (MOSFET) for EEPROM according to a seventh embodiment of this invention.

Figure 14A:
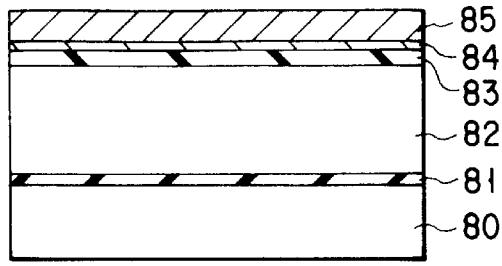
FIGS. 14A to 14D are cross sectional views of a semiconductor device respectively showing the sequential steps of a method for forming a field effect transistor for EEPROM according to a seventh embodiment of this invention.

First, as shown in FIG. 14A, a tunnel oxide film 81 (film thickness 5 nm) is formed on a substrate 80 of single crystal silicon, and a polysilicon film 82 (film thickness 300 nm) is formed on the tunnel oxide film by the CVD (Chemical Vapor Deposition) method.

Next, an ONO (Oxide Nitride Oxide) film 83 (film thickness 16 nm) is formed on the polysilicon film 82 by the CVD method, a WSiN film 84 (film thickness 2 nm) is formed on the ONO film by the reactive sputtering method, and then a tungsten film 85 (film thickness 100 nm) is formed on the WSiN film by the sputtering method.

Figure 14B:
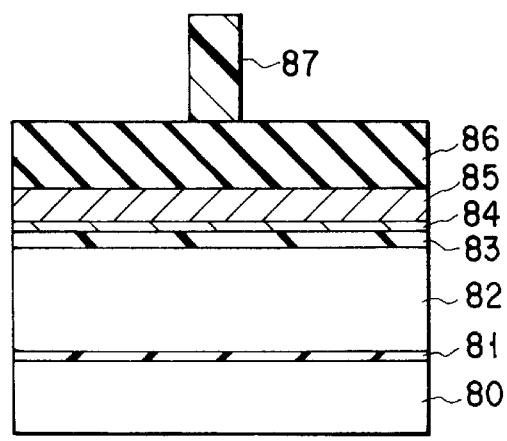

Next, as shown in FIG. 14B, a silicon nitride film 86 (film thickness 200 nm) is formed on the tungsten film 85 by the CVD method, then a photoresist (film thickness 1 μm) is coated on the silicon nitride film 86 by the spin coating method, and the photoresist is exposed via a photomask and developed to form a resist pattern 87 with 0.25 μm width, for example.

Figure 14C:
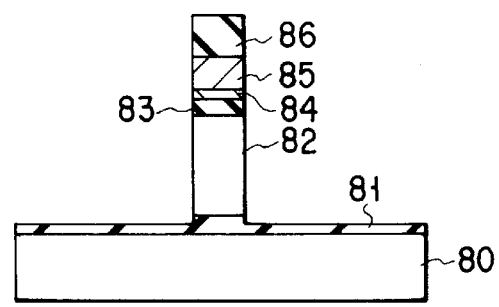

After this, as shown in FIG. 14C, the silicon nitride film 86 is etched along the resist pattern 87 by use of a dry etching device, and then, the remaining resist pattern 87 is removed by $O_2$ ashing.

Then, the tungsten film (W) 85, WSiN layer 84, ONO layer 83 and polysilicon film 82 are etched with the silicon nitride film 86 used as an etching mask.

Figure 14D:
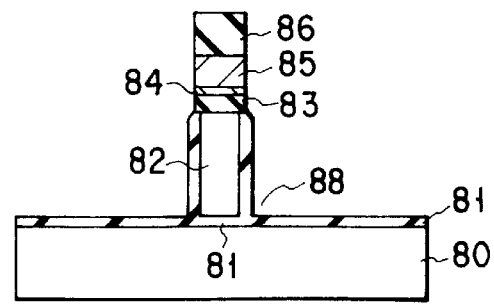

Next, as shown in FIG. 14D, selective oxidation for silicon is effected in the $N_2/H_2/H_2O$ atmosphere in a temperature range of 700 to 900° C. while controlling the partial pressures of the gases. The selective oxidation is effected to restore the film thickness of the tunnel silicon oxide film 81 which is partly cut off at the time of etching of the polysilicon film 82 and round the corner portion 88 of the bottom portion of the polysilicon film. By the selective oxidation, only silicon is oxidized and a lowering in the reliability due to concentration of the electric field in the corner portion of the bottom portion can be prevented.

It was confirmed that neither oxidation of the upper portion of the polysilicon film 82 nor an increase in the film thickness of the ONO film 83 was observed after the above selective oxidation and the WSiN layer 84 prevented the inward diffusion of the oxidant from the external atmosphere.

The same effect was recognized not only in the $N_2/H_2/H_2O$ atmosphere, but also in an atmosphere of a small amount of oxygen, a mixed gas atmosphere of $O_2$ and $H_2$ or a small amount of water vapor or a mixed gas atmosphere of CO and $CO_2$.

In a transistor used for EEPROM, an ONO film formed between the control gate electrode (tungsten film 85) and the floating gate electrode (polysilicon film 82) is used as the insulating film for charge storage. Therefore, the film thickness of the ONO film defines the storage capacity and the storage capacity decreases with an increase in the film thickness thereof.

According to this embodiment, it is possible to prevent an increase in the film thickness of the ONO film by disposing the oxidation preventing film on the ONO film. Therefore, the transistor characteristic is not deteriorated and the reliability of the tunnel oxide film can be enhanced.

Further, in the present embodiment, the ONO film formed by the CVD method is used as the charge storage insulating film, but the film can be formed by the heat treatment in an atmosphere containing oxygen and nitrogen atoms. Further, the film may be formed by a combination of the CVD method and the heat treatment.

This invention is not limited to the above embodiments. For example, in the above embodiment, a case wherein tungsten is used as refractory metal contained in the oxidation preventing film is explained, but the same effect can be attained when another refractory metal is used if a value obtained by subtracting an amount of drop in the Gibb's free energy caused when the nitride of silicon is formed from an amount of drop in the Gibb's free energy caused when the nitride of the refractory metal is formed is negative.

Further, the oxidation preventing film may contain both of nitrogen and carbon.

In the above embodiment, a case of the gate electrode is explained, but this invention can be applied to another type of electrode and wiring. Particularly, this invention is preferably applied to a wiring such as a word wiring in which the RC delay is significantly large. Further, this invention can be applied to an element other than the MOS transistor.

In the above embodiment, the selective oxidation for silicon is effected in the $N_2/H_2/H_2O$ atmosphere while controlling the partial pressures of the gases. Next, a semiconductor manufacturing system suitable for control of the gas partial pressures and a manufacturing method using the same are explained.

Eighth Embodiment

Figure 15:
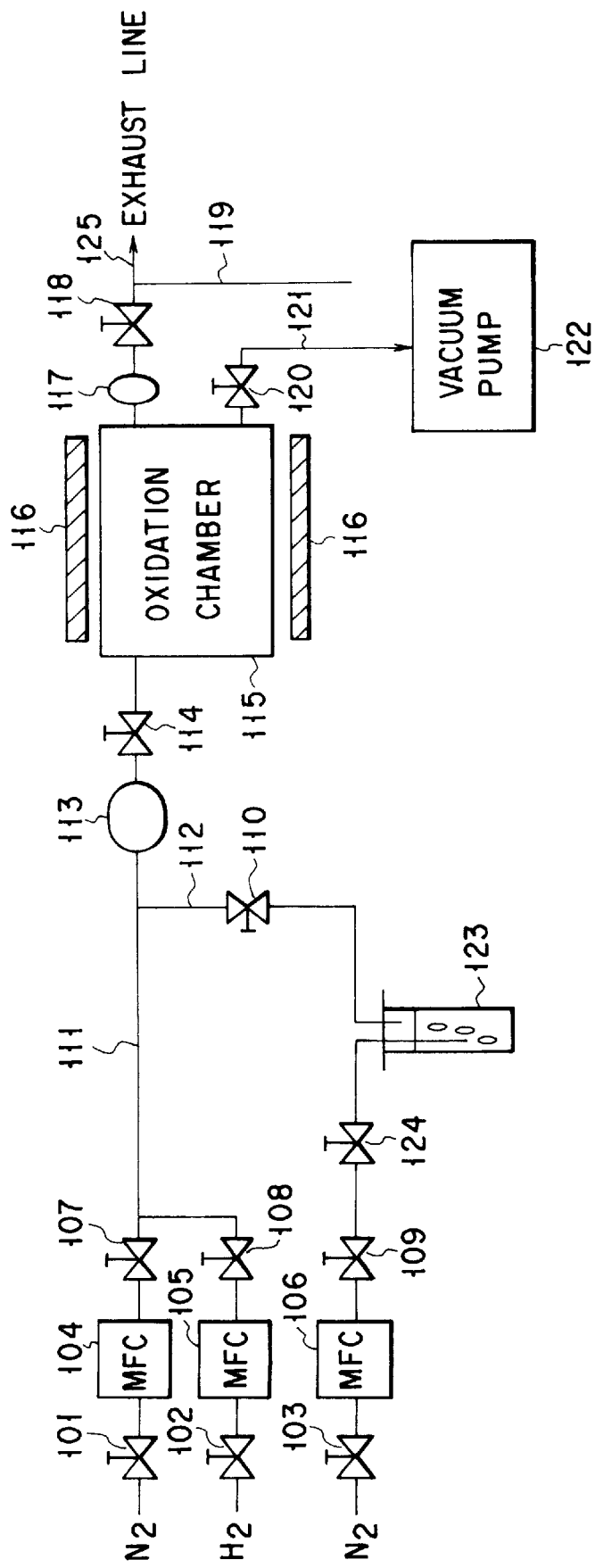
FIG. 15 is a system diagram showing the schematic structure of a semiconductor manufacturing system according to an eighth embodiment of this invention.

FIG. 15 is a system diagram showing the schematic structure of a semiconductor manufacturing system according to an eighth embodiment of this invention.

In FIG. 15, a reference numeral 115 denotes a process chamber (an oxidation chamber) used for receiving and oxidizing a to-be-processed substrate such as a Si wafer, and $H_2$ gas and $H_2O$ gas are permitted to be introduced into the process chamber 115 together with $N_2$ gas (non-oxidizing gas).

The $H_2$ gas is introduced into the process chamber 115 via a valve 102, mass flow controller 105, valve 108, inlet pipe 111, moisture meter 113 and valve 114. At this time, first $N_2$ gas is introduced into the process chamber 115 via a valve 101, mass flow controller 104, valve 107, inlet pipe 111, moisture meter 113 and valve 114. That is, the $H_2$ gas is introduced into the process chamber 115 with the first $N_2$ gas used as a carrier gas.

On the other hand, the $H_2O$ gas is supplied by introducing the vapor of pure water sealed in a bubbler 123 into the process chamber 115 via a valve 110 and inlet pipe 112 with second $N_2$ gas used as a carrier gas. The second $N_2$ gas is introduced into the bubbler 123 via a valve 103, mass flow controller 106, valve 109 and valve 124.

The $H_2$ gas concentration ($H_2$ gas partial pressure) in the process chamber 115 is controlled by the mass flow controllers 104, 105 and 106. That is, the flow rates of the $H_2$ gas and $N_2$ gas are controlled by the mass flow controllers 104, 105 and 106 so that the $H_2$ gas concentration will be set to a preset value. Further, the $H_2O$ gas concentration in the entire atmosphere in the process chamber is monitored by use of the moisture meter 113.

A heater 116 is provided in the process chamber 115. The temperature of the to-be-processed substrate is set to a preset value by the heater 116. The process chamber 115 is coupled to a vacuum pump 122 via a valve 120. The process chamber 115 is evacuated by the vacuum pump 122. The pressure in the process chamber 115 can be monitored by use of a pressure gauge 117.

In FIG. 15, a reference numeral 118 denotes a valve, 119 denotes a diluted gas inlet line, 121 denotes an evacuation line, and 125 denotes an exhaust line.

The inventors checked oxidation of Si, W by using the thus constructed semiconductor manufacturing system.

First, an experiment was made to check oxidation of Si and W by changing the partial pressure ratio ($P(H_2O)/P(H_2)$) of the $H_2$ gas and $H_2O$ gas with the $H_2$ gas concentration fixed at a value less than 4% (less than the flammability limit).

In this experiment, the substrate temperature was set at 800° C., the oxidation time was set to 30 minutes and the total pressure was fixed at approximately $1\times10^5$ Pa (1 atm).

Oxidation of the W surface was determined based on the shifting of a W peak by XPS (X-ray Photoelectron Spectroscopy) and the shape of the W surface detected by SEM (Scanning Electron Microscope). The oxidation amount of silicon was measured by ellipsometer.

Figure 16:
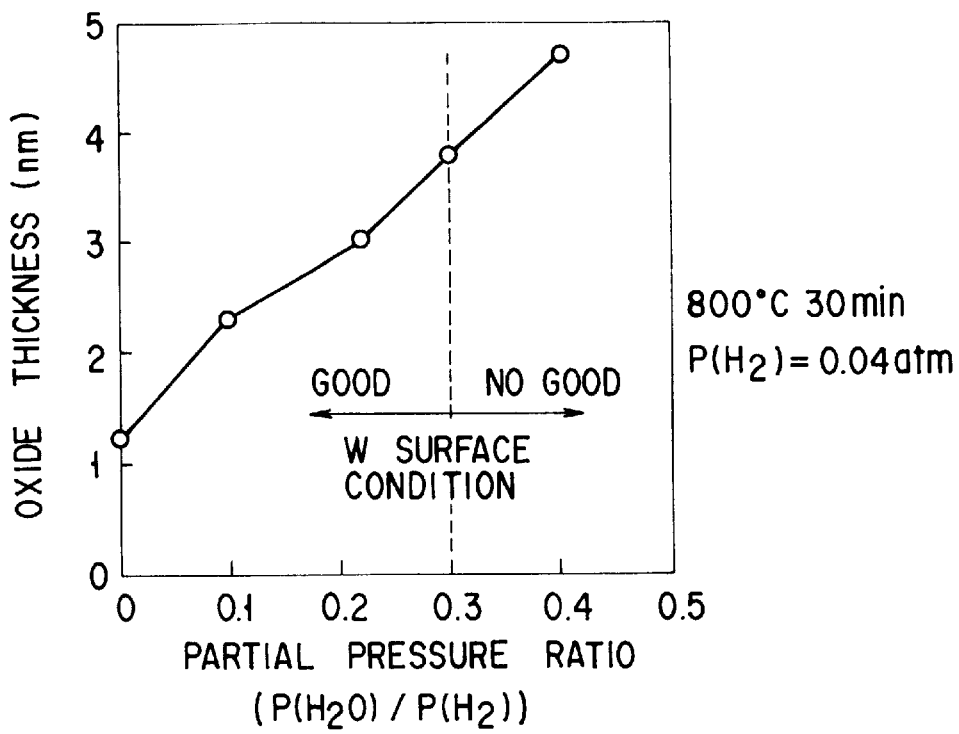
FIG. 16 is a characteristic diagram showing the relation between the partial pressure ratio $P(H_2O)/P(H_2)$ and the film thickness of the oxide film in the eighth embodiment.

FIG. 16 is a characteristic diagram showing the relation between the partial pressure ratio $P(H_2O)/P(H_2)$ obtained as the result of the above experiment and the film thickness (oxide film thickness) of a silicon oxide film formed on Si.

It was confirmed that the W surface was not oxidized and kept smooth in a range of the partial pressure ratio $P(H_2O)/P(H_2)$ of 0.3 or less and a silicon oxide film of approximately 3 nm thickness could be formed on Si when the partial pressure ratio $P(H_2O)/P(H_2)$ was 0.22.

Also, it was recognized that the W surface became rough when the partial pressure ratio $P(H_2O)/P(H_2)$ exceeded 0.3. Further, it was confirmed that the partial pressure ratio $P(H_2O)/P(H_2)$ at which the W surface started to become rough became higher as the temperature of the to-be-processed substrate was higher. It is preferable to adequately set the partial pressure ratio $P(H_2O)/P(H_2)$ in a range of 0.2 to 0.4 according to the temperature.

Figure 17:
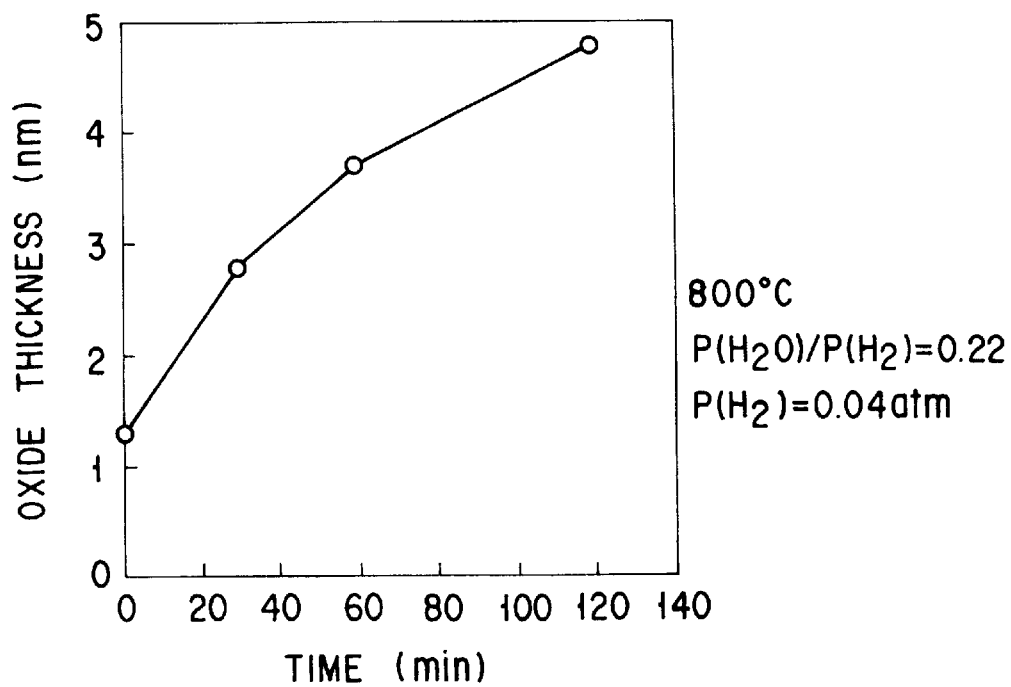
FIG. 17 is a characteristic diagram showing the relation between the oxidation time and the film thickness of the oxide film in the eighth embodiment.

FIG. 17 shows the time dependency of the oxide film thickness in a case where $P(H_2)$=4000 Pa (0.04 atm), $P(H_2O)/P(H_2)$=0.2, and the substrate temperature is 800° C. The concentration of hydrogen is set to the flammability limit or less (4% or less).

It is understood from FIG. 17 that an oxide film of approximately 4 to 5 nm thickness can be formed by oxidation with the substrate temperature of 800° C. and the oxidation time of 120 min. It was confirmed that W was not oxidized and the W surface was kept smooth at this time by observation based on XPS and SEM.

FIG. 18 is a characteristic diagram showing the relation between the oxidation temperature and the film thickness of the oxide film in a case where oxidation is effected with the substrate temperature of 800 to 950° C. and the oxidation time of 30 min in the same gas condition as that in the case of FIG. 17. It is understood from FIG. 18 that a silicon oxide film of approximately 12 nm thickness can be formed without oxidizing W by oxidation effected with the substrate temperature of 900° C. and the oxidation time of 30 min.

It was understood from the above result that Si could be selectively oxidized with the W surface kept smooth even if the concentration of hydrogen was set to the flammability limit or less. Therefore, according to this embodiment, since hydrogen gas can be treated in the same manner as a normal non-flammable gas, selective oxidation of silicon can be safely effected.

In the above experiment, the substrate temperature was set at 800° C. or more, but it was also confirmed that the same effect could be attained if the substrate temperature was set at 600° C. or more, that is, if it was set at the temperature at which silicon could be oxidized or more (oxidation limit or more).

Further since the above selective oxidation can be effected by use of the semiconductor manufacturing system which is simple in construction as shown in FIG. 15, that is, a semiconductor manufacturing system of the structure having a supply system for $N_2$ gas (non-oxidizing gas) which is a carrier gas in addition to the structure of the conventional semiconductor manufacturing system, the cost of the system will not be raised.

Figure 19A:
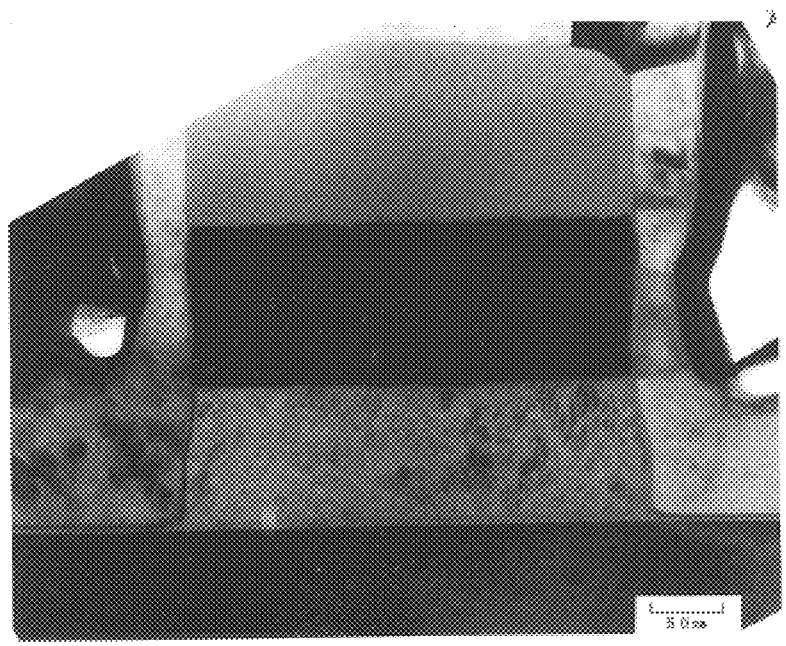
FIGS. 19A to 19C are microphotographs showing the crystal structure of the main portion of the semiconductor device in the eighth embodiment, FIG. 19A being a microphotograph showing polymetal after RIE (before post-oxidation), FIG. 19B being a microphotograph showing an oxide film with a film thickness of 4 nm on an Si substrate and FIG. 19C being a microphotograph showing an oxide film with a film thickness of 12 nm on the Si substrate.
Figure 19B:
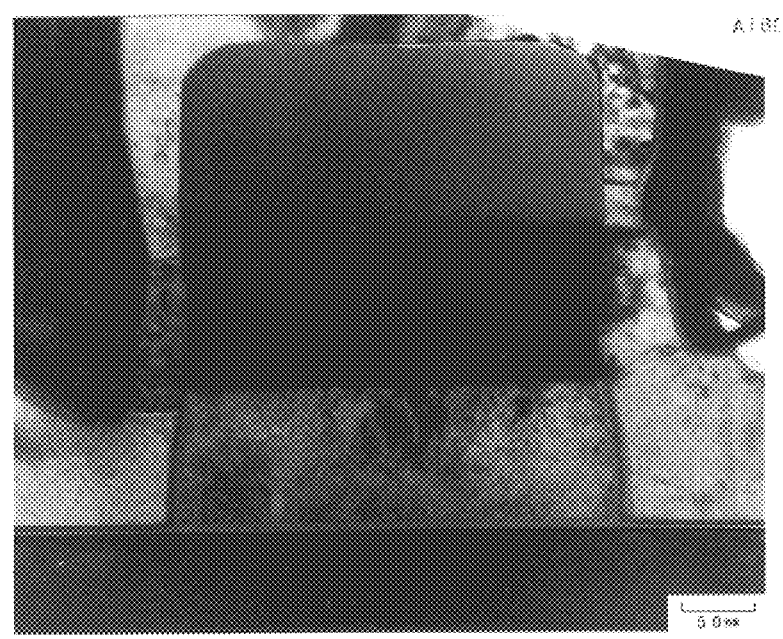
Figure 19C:
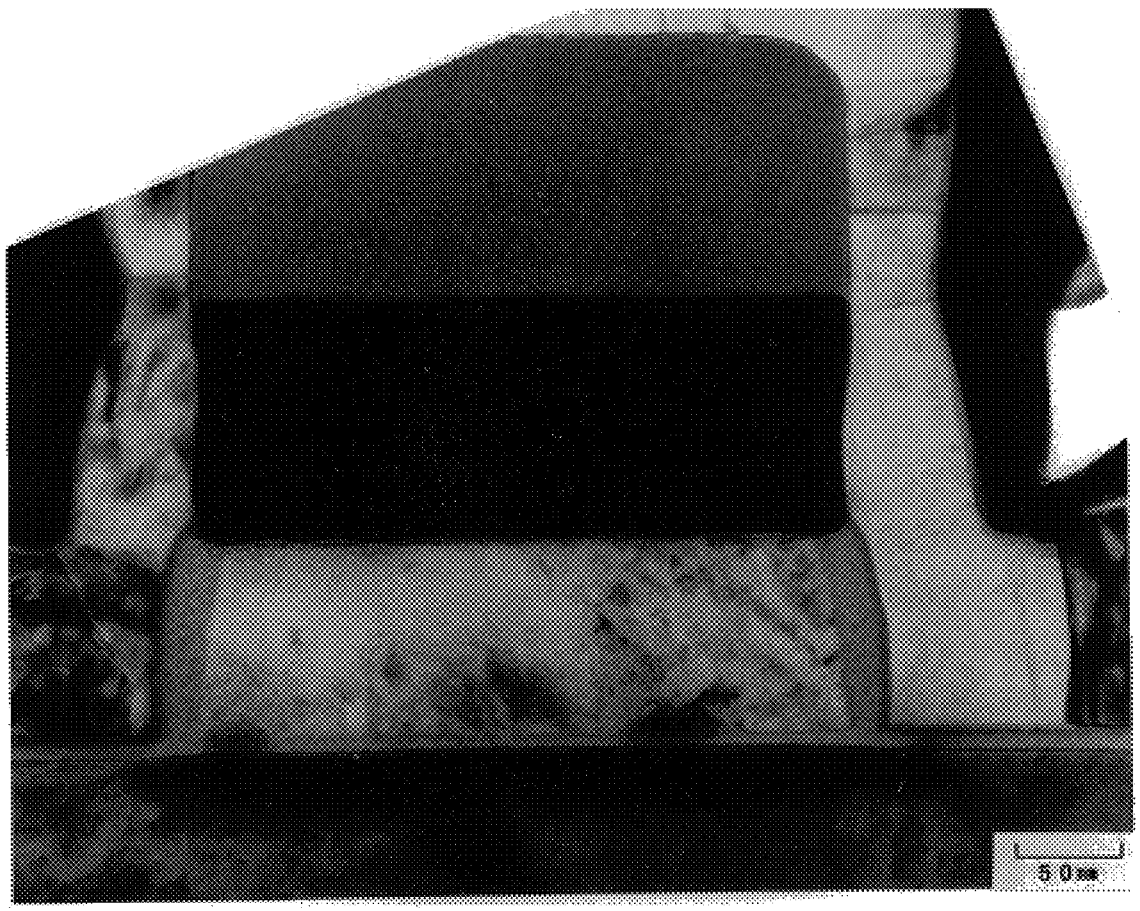

FIGS. 19A to 19C are microphotographs showing polymetal gates obtained before and after the selective oxidation of the present embodiment is effected.

FIG. 19A shows a state set by sequentially forming a polysilicon film, WSiN film and W film on a Si substrate, patterning the laminated film by RIE and then forming a polymetal gate.

FIG. 19B shows a state set by forming a silicon oxide film of 4 nm thickness by the selective oxidation method of this embodiment, and FIG. 19C shows a state set by forming a silicon oxide film of 12 nm thickness by the selective oxidation method of this embodiment.

It is understood from FIGS. 19B and 19C that an $SiO_2$ film is selectively formed on the Si surface without deteriorating the shape of the W film.

Ninth Embodiment

FIG. 20 is a system diagram showing the schematic structure of a semiconductor manufacturing system according to a ninth embodiment of this invention. The system can be obtained by improving the semiconductor manufacturing system of FIG. 15.

In FIG. 20, a reference numeral 206 denotes a process chamber used for receiving and oxidizing a to-be-processed substrate 208 such as a Si wafer and a supporting unit 207 capable of simultaneously supporting a plurality of to-be-processed substrates 208 is provided in the process chamber 206. The supporting unit 207 is formed of an insulating material such as quartz, SiC or the like.

The systems on the right side and left side of the process chamber 206 respectively correspond to the gas inlet system and gas exhaust system of the semiconductor manufacturing system of FIG. 15. The gas inlet system is formed with substantially the same structure except that $H_2O$ gas is supplied without using a bubbler (123 in FIG. 15). For example, $H_2O$ can be obtained by heating a vaporizer.

That is, valves 210, 212 to 214, 218 to 220, mass flow controllers (MFC) 215 to 217, and hydrogen supply line 225 correspond to the valves 114, 107 to 109, 101 to 103, mass flow controllers 104 to 106, and hydrogen supply line 111 of FIG. 15. As shown in the drawing, $N_2$ gas is introduced to dilute $H_2$ gas. $H_2O$ gas may be diluted by $N_2$ gas.

The gas exhaust system is improved, and like a normal low-pressure CVD system, a vacuum pump 201 such as a dry pump and a pressure control device 204 are provided so that the pressure in the reaction chamber 206 can be reduced to approximately 1 Pa. Further, a conductance valve 205 is provided and the pressure control at approximately 0.8 atmosphere can be effected. A reference numeral 224 denotes a pressure gauge, 202 denotes an exhaust line, and 203 denotes a dilute line by an inert gas.

The same effect as that of the former embodiment can also be attained in this embodiment and the following two further effects can be obtained by the above improvement.

The first effect is that the hermeticity at the low pressure can be checked in the same manner as in the low-pressure CVD system and therefore the hermeticity of the system can be checked at the starting time of the oxidation process.

Thus, oxidation can be certainly effected in the highly hermetic condition. The possibility of introduction of oxygen becomes extremely low and oxidation can be stably effected even if the concentration of hydrogen is raised.

Further, oxidants such as oxygen and water introduced into the system at the time of release of atmospheric pressure or oxidants such as oxygen and water adsorbed in the system can be almost entirely discharged by temporarily lowering the pressure to approximately 1 Pa. Therefore, the oxidation process can be started under the further controlled condition.

The second effect is that oxidation can be effected at a pressure slightly lower than the air pressure and the damage of the system and the danger on the surroundings due to a rise in pressure can be prevented even if the concentration of hydrogen slightly exceeds the flammability limit and hydrogen is burnt.

One example of the trial calculation is shown below.

Hydrogen is burnt according to the following reaction formula and heat of approximately 249 kJ is generated for one mol at 800° C. at the atmospheric pressure.

$2H_2+O_2 \rightarrow 2H_2O+249 \times 2$ kJ

If the capacity of the process chamber 206 is 50 l, the volume of 4% $H_2$ becomes 2 l. The total pressure is set to $8 \times 10^4$ Pa (0.8 atm) which is equivalent to approximately 0.07 mol when it is expressed in terms of molarity. An amount of energy generated at this time is 17.4 kJ.

If the specific heat of a gas filling the internal space of the process chamber 206 is regarded as being approximately equal to the isometric specific heat of $N_2$, the temperature rise becomes approximately 470° C. since $V_{v.N2}$=0.74 J/k.g.

The pressure rise at this time is approximately 1.4 times and the pressure becomes approximately $1.14 \times 10^5$ Pa (1.14 atm) since the pressure at the starting time is $8 \times 10^4$ Pa.

Therefore, if the pressure rise is a positive pressure of approximately 0.14 atmosphere with respect to the atmospheric pressure, even the vacuum system of normal strength will not be damaged.

Tenth Embodiment

FIG. 21 is a system diagram showing the schematic structure of a semiconductor manufacturing system (cold wall type heating system) according to a tenth embodiment of this invention.

The cold wall type heating system mainly includes a process chamber 311 which can be evacuated and used for receiving and oxidizing a to-be-processed substrate 322, a gas inlet system 312 for introducing $H_2O$ gas diluted by $N_2$ gas whose flow rate is precisely controlled, a gas inlet system 313 for introducing $H_2$ gas diluted by $N_2$ gas whose flow rate is precisely controlled, and a substrate supporting base 314 also used as a heating source. The heating source is constructed by a resistance heater, for example.

When the cold wall type heating system is used, the temperature of the inner wall of the process chamber 311 is set to approximately the room temperature, and therefore, if the selective oxidation is effected in the atmosphere used in the former embodiment, water vapor tends to condense on the inner wall of the process chamber 311 and it may become difficult to control the partial pressure of water vapor depending on the gas inlet path. Therefore, in this embodiment, a heating plate 315 heated to 50° C. or more is provided in the process chamber 311.

Next, the selective oxidation of Si by use of the cold wall type heating system, more specifically, the selective oxidation of Si in a laminated film (polymetal gate) of W/WSiN/Si is explained.

First, a to-be-processed substrate 322 having a laminated film of W/WSiN/Si formed thereon is fed into the process chamber 311.

Then, a valve 319 is opened to evacuate the process chamber 311 by means of a dry pump 320, and after this, the valve 319 is closed and valves 316 and 318 are opened to set the degree of vacuum in the process chamber 311 to approximately 10 Pa by means of a turbo-molecular pump 317.

Next, the selective oxidation of Si is effected by introducing $H_2$ gas diluted to 4% or less by $N_2$ gas into the process chamber 311 via the gas inlet system 313 and passing $H_2O$ gas diluted by $N_2$ gas above the to-beprocessed substrate 322 via the gas inlet system 312. At this time, the temperature of the to-be-processed substrate 322 is set at 600° C. or more.

The order of introduction of gases is determined to prevent the $H_2$ gas concentration from becoming larger than a desired preset value which may cause the selective oxidation. Therefore, if the gas introducing order is reversed, oxidation of W may occur in the initial stage of the gas introducing process since the equilibrium partial pressure of water vapor with respect to the oxide of W or WSiN is exceeded.

The total gas pressure is set at approximately 0.1 to 0.9 atmosphere so as to protect the process chamber 311 from being destroyed even when the $H_2$ gas is burnt in the process chamber 311.

The exhaust gas is exhausted from the exhaust port of the dry pump 320 via a pipe 321, and at this time, $N_2$ gas is introduced from a pipe 323 to further lower the $H_2$ gas concentration.

When the above selective oxidation is completed, introduction of $H_2O$ gas via the gas inlet system 312 is interrupted, then introduction of $H_2$ gas diluted by $N_2$ gas from the gas inlet system 313 is interrupted, and the to-be-processed substrate 322 is fed out from the process chamber 311.

The order of interruption of gas introduction is determined to prevent the $H_2$ gas concentration from becoming larger than a desired preset value which may cause the selective oxidation. Therefore, if the gas inlet interrupting order is reversed, oxidation of W may occur in the final stage of the gas introducing process since the equilibrium partial pressure of water vapor with respect to the oxide of W or WSiN is exceeded.

In this embodiment, the substrate supporting base 314 is also used as the heating source of the to-be-processed substrate 322, but in this case, it is necessary to always set the heater of the heating source in the ON state, and therefore, the process chamber 311 before and after the carry-out of the to-be-processed substrate 322 must be a vacuum tank in order to prevent oxidation of W and WSiN.

Eleventh Embodiment

FIG. 22 is a system diagram showing the schematic structure of a semiconductor manufacturing system (cold wall type heating system) according to an eleventh embodiment of this invention.

The cold wall type heating system of this embodiment is different from that of the tenth embodiment in that a lamp 423 capable of rapidly raising and lowering the temperature is used as the heating source, gas is supplied to the surface of a to-be-processed substrate 422 from a shower head 425 provided on the outer periphery of the to-be-processed substrate 422, and a substrate supporting base 414 is rotatably mounted.

The lamp 423 and shower head 425 construct part of a gas inlet portion 424. That is, the gas inlet portion 424 is constructed by a gas inlet system 412 for introducing $H_2O$ gas diluted by $N_2$ gas whose flow rate is precisely controlled, a gas inlet system 413 for introducing $H_2$ gas diluted by $N_2$ gas whose flow rate is precisely controlled, the lamp 423, and the shower head 425.

The other structure thereof is basically the same as that of the third embodiment. That is, valves 416, 418, 419, turbomolecular pump 417, dry pump 420, pipes 421, 426 respectively correspond to the valves 316, 318, 319, turbomolecular pump 317, dry pump 320, pipes 321, 323 of FIG. 21.

In this embodiment, the same effect as that of the tenth embodiment can be attained. Further, in this embodiment, since the supporting base 814 for supporting the semiconductor substrate 422 is rotatably mounted, the effect that the uniformity of gas flow and the uniformity of heating by the lamp 423 can be improved can be obtained.

Specifically, the temperature distribution on the surface of the to-be-processed substrate 422 is set in a range of 800° C.±2° C. (within 6 σ) and is extremely uniform and the distribution of the oxide film thickness on the Si surface is set in a range of 7 nm±0.1 nm (within 6 σ) and is extremely uniform.

Twelfth Embodiment

If the above-described cold wall type heating system is provided with other process system in a multichamber form, the manufacturing efficiency can be enhanced and the reliability can be enhanced by the vacuum successive processes.

Specifically, the other systems include a reactive ion-etching system for etching a laminated film used as a gate wiring or gate electrode with polymetal structure, a resist removing system such as an oxygen plasma ashing system for removing a resist used in the above etching process, and a system for effecting the process using an alkali-series etchant or HF vapor, water-washing and drying.

The above process systems and the cold wall heating system are arranged to construct a multichamber type system for successively effecting the processes.

By using the multichamber type system, the term of work was reduced by at least 30%, the LSI manufacturing efficiency was enhanced, the occupied space of the clean room was reduced by approximately half, and COO (cost of ownership) was reduced.

The manufacturing system of this invention is not limited to the above embodiment. For example, in the above embodiment, $N_2O$ gas is used as a carrier gas and diluting gas, but another inert gas such as Ar gas can be used.

Further, in the eighth to eleventh embodiments, the selective oxidation of Si of the polymetal gate is explained, but it can be applied to a process including a non-oxidation process of Si under the gate electrode which is explained in the first to seventh embodiments.

The gate structure capable of suppressing the RC delay due to unfavorable oxidation of silicon in the polymetal gate and metal gate to which the silicon selective oxidation technique is applied, and the safe manufacturing system and manufacturing method suitable for the selective oxidation of silicon are explained. In the following embodiments, a gate structure for preventing impurity in silicon from being thermally diffused into refractory metal or refractory metal silicide in the laminated gate structure such as polycide or polymetal and a manufacturing method therefor are explained.

Thirteenth Embodiment

FIGS. 23A, 23B, 24A, 24B show data of secondary ion mass spectrometry exhibiting the impurity diffusion preventing effect in a sample of multilayered structure in a thirteenth embodiment of this invention. The thicknesses of respective layers of the sample of multilayered structure are shown in the upper portion of FIG. 23A with a scale corresponding to the abscissa of FIG. 23A.

That is, an $SiO_2$ layer of 100 nm thickness was formed on a silicon substrate (which is not shown on the scale) and a polysilicon layer containing As or B (boron) as impurity with a concentration of $1 \times 10^{20}/cm^2$ was formed to a thickness of 100 nm. A diffusion preventing layer of $WSi_xN_y$ of 5 nm thickness was formed on the polysilicon layer by a method for depositing a $WSi_x$ target (x=2 to 3) by use of the reactive sputtering method in a mixed gas atmosphere of Ar and $N_2$ with the mixture ratio of 1:1 or depositing W on the polysilicon layer by use of the reactive sputtering method for sputtering a target of W in the above mixed gas atmosphere. Then, W was deposited to a thickness of 100 nm on the top layer by the sputtering method to form the sample of multilayered structure in the thirteenth embodiment.

For evaluating the impurity diffusion effect in the sample having the polysilicon layer containing As, the distributions of impurity in the depth direction obtained when the sample was subjected to the heat treatment at 800° C. for 30 minutes and at 950° C. for 30 minutes in the $N_2$ atmosphere are shown in FIGS. 23A and 23B. The result of mass spectrometry of FIG. 23A is explained as follows.

In the secondary ion mass spectrometry (SIMS), the composition of the material is determined by applying the primary ion beam to the sample of multilayered structure to etch the same and subjecting secondary ions emitted at this time to the mass spectrometry. Thus, the relation between the etching depth and the composition of the material is obtained. The abscissa of FIG. 23A indicates the etching depth corresponding to the accumulated value of the thicknesses of the respective layers of the sample of multilayered structure. The ordinate indicates the secondary ion strength.

As shown in FIG. 23A, it was found that (W+N) and Si were detected in addition to W in a range of 100 nm of the sample surface formed of a W layer after the heat treatment at 800° C. for 30 minutes, but diffusion of the impurity As in polysilicon into W was sufficiently suppressed in a portion except the surface portion since a $WSi_xN_y$ diffusion preventing layer was formed on the interface between W and polysilicon. In FIG. 23A, it looks as if W and (W+N) are present in the polysilicon layer and $SiO_2$ layer, but this is only an apparent phenomenon caused by an extension of the etching shape by application of the primary ion beam.

The resistance of the multilayered structure can be reduced by forming pure W on the top layer of the multilayered structure, but if impurity is diffused into the W layer, it may result in the gate depletion due to the impurity concentration lowering in the Si layer under the W layer, the mutual diffusion of the impurities between n and p regions of a CMOSFET, and the like. Since W, Si and N form a stable compound, the resistance will not increase and the film quality will not be degraded even if the above elements of an amount as shown in FIG. 23A are introduced into W. Thus, it was found that the reliability of the multilayered structure could be enhanced by inserting the $WSi_xN_y$ diffusion preventing layer.

The result of mass spectrometry obtained by subjecting the same sample to the heat treatment at 950° C. for 30 minutes is shown in FIG. 23B. The amount of As in W is increased by approximately one figure in comparison with the case of FIG. 23A, but since the concentration of As in W estimated from the above result is as low as $1\times10^{18}/cm^3$, it is considered that the effect of the $WSi_xN_y$ diffusion preventing layer is sufficiently large in the LSI heat treatment normally effected.

The results of mass spectrometry obtained in a case where B is introduced as impurity into the polysilicon layer are shown in FIGS. 24A and 24B. It was found that the degree of diffusion of B into W in each of the heat treatments at 800° C. and 950° C. for 30 minutes was as small as practically negligible. Further, it was found that the same effect could be obtained for the other donor and acceptor impurities different from As and B introduced into the polysilicon layer.

Fourteenth Embodiment

Figure 25A:
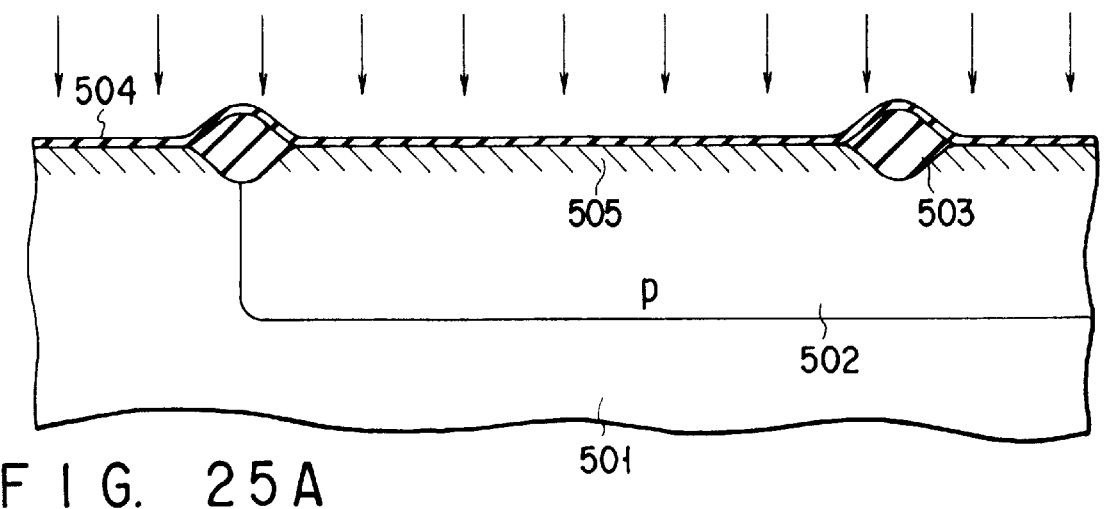
FIGS. 25A to 25C are cross sectional views respectively showing the sequential steps of a method for forming a MOSFET according to a fourteenth embodiment of this invention.
Figure 25B:
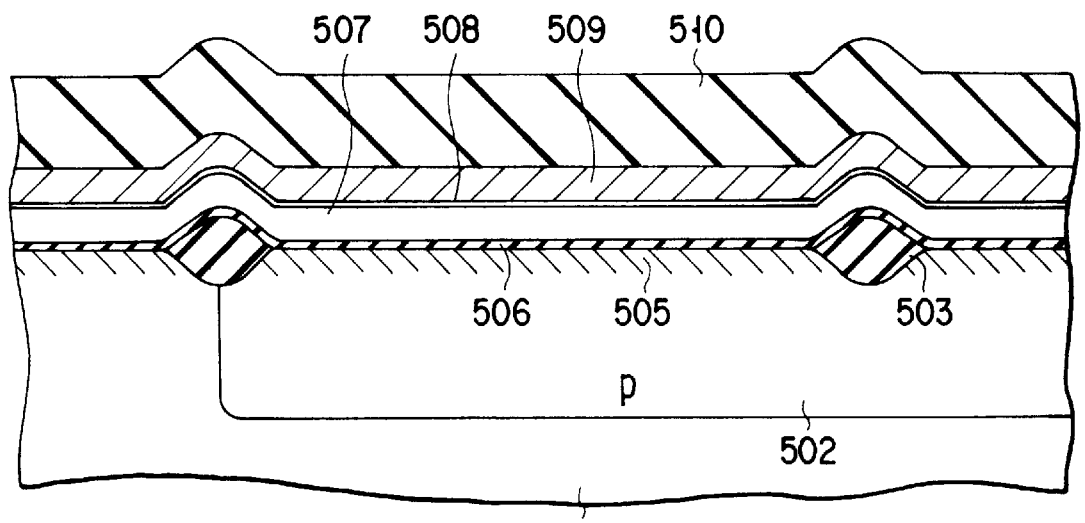
Figure 25C:
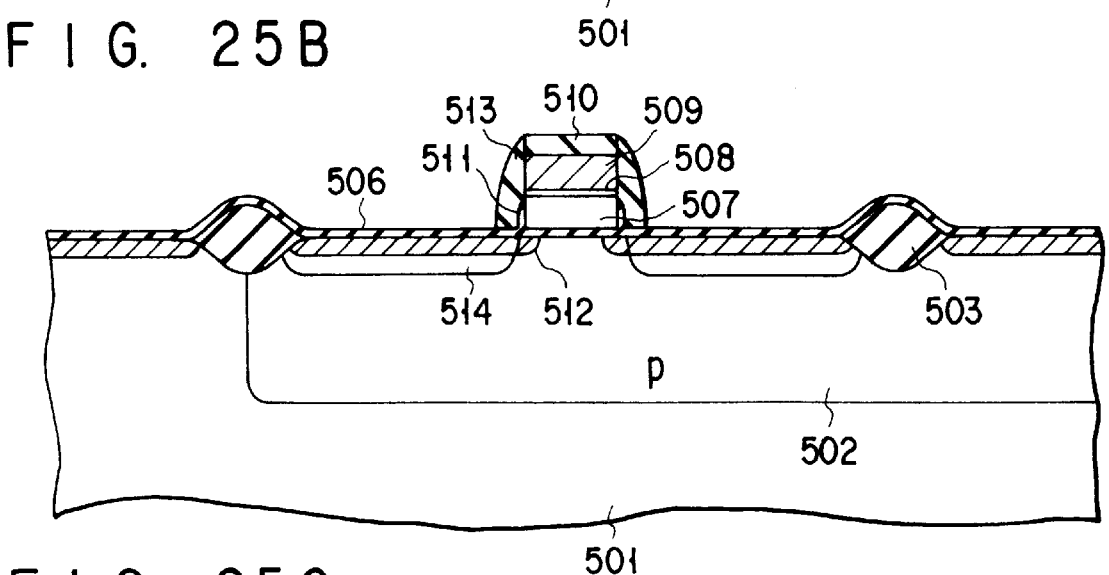

A fourteenth embodiment of this invention is explained with reference to FIGS. 25A to 25C. FIGS. 25A to 25C are cross sectional views for illustrating a method for manufacturing a semiconductor device using a multilayered structure of this invention.

As shown in FIG. 25A, a p-type region 502 of approximately 1 μm depth is formed by ion-implanting B into a silicon substrate 501 and then effecting the thermal diffusion process. Next, after an element isolation oxide film 503 of approximately 600 nm thickness is formed in a preset region, a protection oxide film 504 of approximately 10 nm thickness is formed and ion-implantation is effected to adjust the threshold voltage of a MOSFET (hatched portion 505).

Then, as shown in FIG. 25B, the protection oxide film 504 is removed and oxidation for several nm to several ten nm is effected to form a gate oxide film 506.

After this, amorphous silicon is deposited to a thickness of 100 nm by the CVD (Chemical Vapor Deposition) method and P (phosphorus) is introduced into the amorphous silicon layer by the ion implantation technique. The injection of impurity element may be effected by diffusion in the vapor phase or solid phase. In either case, the impurity concentration is set to approximately $2\times10^{20}/cm^3$ or more. The heat treatment for activating P injected into the amorphous silicon layer by ion-implantation is effected at 800° C. for 30 minutes. By the heat treatment, the amorphous silicon layer is changed into a polysilicon layer 507.

Next, the dilute hydrofluoric acid process is effected to remove a native oxide film formed on the polysilicon layer 507 and then the reactive sputtering method using a W target is effected in a mixed gas of Ar and $N_2$ to form a $WSi_xN_y$ film 508 of approximately 5 nm thickness. After this, the reactive sputtering method using a W target is effected in an Ar atmosphere or the CVD method using $WF_6$, $SiH_4$ gas is effected to form a W film 509 of approximately 100 nm. Next, the LPCVD method using $SiH_2Cl_2$, $NH_3$ gas is effected at the growth temperature 800° C. for 30 minutes to form an $SiN_x$ film 510 of approximately 250 nm thickness.

Conventionally, impurity contained in polysilicon is diffused into W to make a problem in the above step of forming the $SiN_x$ film at 800° C. for 30 minutes, but impurity diffusion from the polysilicon film 507 to the W film 509 can be suppressed by using the $WSi_xN_y$ film 508 of this invention as a diffusion preventing film.

Next, a desired pattern of gate electrode or wiring is formed by use of a resist, the $SiN_x$ film 510 is removed by the RIE method with the pattern used as a mask, and the W film 509, $WSiN_x$ film 508 and polysilicon film 507 are patterned by the RIE method with the $SiN_x$ film used as a mask so as to form a gate electrode or wiring of multilayered structure.

Next, selective oxidation is effected at 800° C. for 30 minutes in an $H_2O$, $H_2$, $N_2$ atmosphere to form an oxide film 511 shown in FIG. 25C. By the selective oxidation, only silicon can be oxidized without oxidizing W so that an oxide film can be formed on the side surface of the polysilicon film of the gate electrode and the silicon substrate surface.

Next, As is ion-implanted into shallow portions of the source/drain regions in a condition of the acceleration voltage 20 keV and dose amount $5\times10^{14}/cm^2$ to form LDD (Lightly Doped Drain) regions 512. Then, an $SiN_x$ film of approximately 50 nm thickness is formed on the gate electrode and anisotropic etching is effected by use of the RIE method so as to form a gate structure having an $SiN_x$ film 513 formed on the side wall of the gate as shown in FIG. 25C. Source/drain regions 514 are formed by ion-implanting As from above the gate having the side wall thus formed into deep portions with the acceleration voltage 60 keV and dose amount $7\times10^{15}/cm^2$.

In order to activate injected As, the heat treatment is effected at 900° C. for 30 seconds in an $N_2$ atmosphere, and then a MOSFET of self-aligned gate structure with the side wall insulating film having a gate electrode which has a $WSi_xN_x$ diffusion preventing layer can be formed by forming an inter-level insulating film by the normal method and forming Al contacts and wirings.

According to the method of this invention, P which is contained at a high concentration of $2 \times 10^{20}/cm^3$ in the polysilicon film 507 forming the multilayered metal gate is not diffused into the W film 509 in the selective oxidation process effected at 800° C. for 30 minutes after formation of the multilayered metal gate, the high-temperature heat treatment for activation of As impurity, and the heat treatment effected at 800° C. for approximately one hour for formation of the inter-level insulating film by use of the CVD method, and therefore, a MOSFET having a highly-reliable gate electrode having low resistance can be obtained.

Fifteenth Embodiment

A fifteenth embodiment of this invention is explained with reference to FIGS. 26A and 26B. As shown in FIG. 26A, a p-type region 602 of approximately 1 μm depth is formed by ion-implanting B into a silicon substrate 601 and thermally diffusing the injected impurity. Then, after an element isolation oxide film 603 of approximately 600 nm thickness is formed in a preset region and a protection oxide film (not shown) is formed, ion-implantation is effected to adjust the threshold voltage of a MOSFET (hatched portion 605).

After the protection oxide film is removed, oxidation for approximately 10 nm is effected again to form a tunnel oxide film 615. After this, the oxide film 615 is subjected to the nitriding process at 1000° C. for approximately 30 seconds in an $NH_3$ atmosphere and the re-oxidation process at 1000° C. for approximately 30 seconds is effected. The nitriding process and re-oxidation process have the effect that the interface level of the tunnel oxide film and the trap in the oxide film can be reduced.

Next, a polysilicon film 616 is deposited to a thickness of approximately 200 nm and the heat treatment is effected at 850° C. for 30 minutes in $POCl_3$ so as to dope P into the polysilicon film.

After this, an oxide film 617 of approximately 10 nm thickness is formed on the polysilicon film by thermal oxidation, and after an $SiN_x$ film 618 of approximately 10 nm thickness is formed by the LPCVD method, the surface of the $SiN_x$ film is oxidized at 900° C. for 30 minutes to form an oxide film 619. A polysilicon film 607 of 200 nm thickness is formed on the oxide film and the heat treatment is effected at 850° C. for 60 minutes in a $POCl_3$ atmosphere to dope P into the polysilicon film 607.

After this, the process like the process in the fourteenth embodiment is effected to form a $WSi_xN_y$ film 608, W film 609 and $SiN_x$ film 610 on the polysilicon film 607 as shown in FIG. 26A and a gate electrode of multilayered structure is formed on the tunnel oxide film 615 by use of a resist pattern as shown in FIG. 26B.

Next, As is ion-implanted into the source/drain regions with the acceleration voltage 60 keV and dose amount approximately $1 \times 10^{16}/cm^2$ and the heat treatment for activating the injected impurity is effected at 900° C. for 30 minutes. Then, a MOSFET element for non-volatile memory having the polysilicon floating gate 616 and the control gate electrode (607 to 610) of laminated structure formed over the floating gate with a three-layered insulating layer of the insulating layers 617, 618, 619 disposed therebetween can be formed by forming inter-level films and wirings.

By inserting the $WSi_xN_y$ film 608 into the control gate, the heat resistance of the gate electrode in the heat treatment effected after formation of the control gate is extremely enhanced and a highly reliable MOSFET element for non-volatile memory can be obtained.

Sixteenth Embodiment

A sixteenth embodiment of this invention is explained with reference to FIG. 27. This embodiment is a modification of the fifteenth embodiment, and in this embodiment, a $WSi_x$ film 621 is formed instead of the W film 609 after formation of the $WSi_xN_y$ film 608. The process effected up to the step of forming the $WSi_x N_y$ film 608 is the same as that in the fifteenth embodiment and the explanation therefor is omitted. The $WSi_x$ film 621 is deposited to a thickness of approximately 300 nm by the sputtering method using a target of $WSi_x$ in the Ar atmosphere or by the CVD method using $WF_6$, $SiH_4$ as a source material gas.

After the patterning process using a resist, the silicon film 616 is selectively oxidized and As is ion-implanted into the source/drain regions in a condition of the acceleration voltage 60 keV and dose amount $5 \times 10^{15}/cm^2$. Then, the oxidation process which is also used for activating injected impurity is effected at 900° C. for approximately 60 minutes in an $O_2$ atmosphere. The degree of oxidation is adequately determined according to the required withstand voltage of the gate.

In the above oxidation process, the consumption amount of Si in the $WSi_x$ film 621 is increased by an increase in the oxidation rate due to the ion implantation of As so as to cause Si to be supplied from the polysilicon layer 607 which is a ground layer to the $WSi_x$ film 621. As a result, it is found that $WSi_x$ enters the polysilicon film in the interface between the $WSi_x$ film 621 and the polysilicon film 607, thereby causing a lowering in the withstand voltage.

According to this invention, since diffusion of impurity contained with high concentration in the polysilicon film into the $WSi_x$ film 621 in the oxidation process can be prevented and the movement of Si from the ground polysilicon layer 606 to the $WSi_x$ film 621 can be suppressed by forming the $WSi_xN_y$ diffusion preventing film 608 between the polysilicon film 607 and the $WSi_x$ film 621, a lowering in the withstand voltage is not observed.

Then, a highly reliable MOSFET element for nonvolatile memory can be obtained by forming inter-level insulating films and Al wirings.

Seventeenth Embodiment

FIG. 28 is a cross sectional view showing the structure of a complementary MOSFET (CMOSFET) according to a seventeenth embodiment of this invention. Each MOSFET has a laminated gate structure including a silicon film 707 or 707' and a W film 709.

As described before, the laminated structure of polycide or polymetal has a defect that it is easily affected by heat in the heat treatment and impurity in silicon is diffused into refractory metal or silicide by thermal diffusion. By the impurity diffusion, the impurity concentration in silicon is lowered, and if a gate voltage for layer inversion is applied, a depletion layer 802' is formed in a gate silicon layer 802 as shown in FIG. 29B to lower the driving ability of the transistor. This phenomenon is known as gate depleting action. FIG. 29A shows a state set when no gate voltage is applied, a reference numeral 801 denotes a silicon substrate, 806 denotes a gate insulating film, 802 denotes a silicon film, 804 denotes a W film, and 805 denotes source/drain regions.

When the above laminated structure is applied to a CMOSFET, impurities (indicated by arrows 810) diffused into the refractory metal (or silicide) film 804 are mutually diffused into the p-type and n-type regions as schematically shown in FIGS. 30A and 30B to change the work function of the gate, thereby changing the threshold voltage. This phenomenon is a problem called interdiffusion of impurities of CMOS.

This embodiment provides a structure for suppressing the interdiffusion of impurities. This embodiment is explained according to the manufacturing process shown in FIGS. 31A to 31I.

First, a resist pattern is formed in a preset region by use of the photolithography technology and B, Ga or In is ion-implanted into the silicon substrate with the resist pattern used as a mask. Likewise, P, As or Sb is ion-implanted into a preset region. Then, the thermal diffusion process is effected to form a p-type region 722 and n-type region 722' of approximately 1 $\mu$m depth (FIG. 31A).

Next, an element isolation oxide film 703 of 600 nm thickness is formed in a preset region (FIG. 31B).

Then, after formation of a protection oxide film of approximately 10 nm thickness, the ion-implantation process is effected to adjust the threshold voltage of the MOSFET, and after the protection oxide film is removed, a gate oxide film 706 of approximately 10 nm thickness is formed. After this, a silicon film 707 of approximately 100 nm thickness is formed. At this time, the silicon film 707 may be formed in an amorphous or polycrystalline form, or in a single crystal form obtained by forming the film partially in contact with the silicon substrate and growing the film by the lateral epitaxial growth.

Next, n-type impurity such as P, As, Sb is ion-implanted into a gate forming region of the silicon film 707 which lies on the p-type region 722 by using a resist as a mask so as to form a n$^+$-type region. Likewise, P-type impurity such as B, Ga, In is ion-implanted into a gate forming region of the silicon film 707' which lies on the n-type region 722' by using a resist as a mask so as to form an P$^+$-type region. The injection of impurity element into the gate region may be effected by diffusion in the vapor phase or solid phase, but in either case, the impurity concentration is set to $2\times10^{20}/$cm$^3$ or more (FIG. 31D).

After a native oxide film formed on the surfaces of the silicon films 707 and 707' during the above process is removed by the dilute hydrofluoric acid process, for example, a WSi$_x$ film 723 with a thickness of 10 nm or less is formed by the sputtering method in an Ar atmosphere by using a target of WSi$_x$ (for instance, x is equal to 0.6) or by the LPCVD method of WF$_6$ and SiH$_4$ series. The WSi$_x$ film 723 is formed to lower the resistance of the contact between Si and W.

Figure 31E:
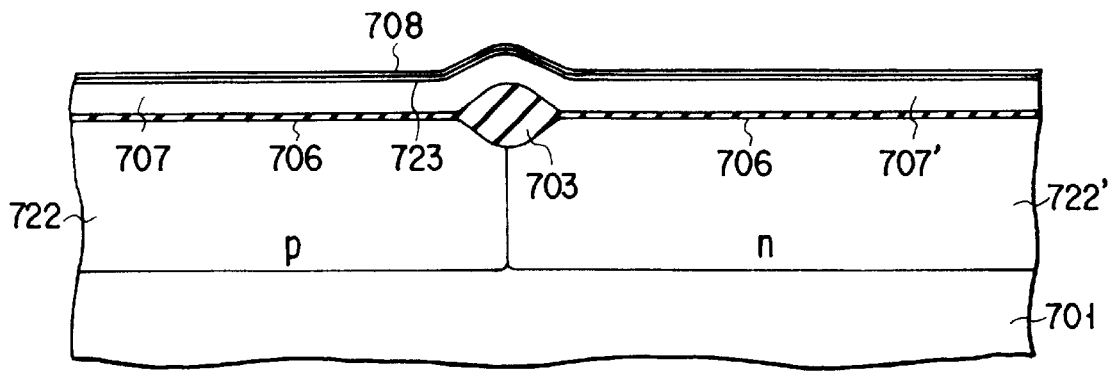

Next, a WSi$_x$N$_y$ film 708 of 5 nm thickness is formed by effecting the sputtering process in a mixed gas atmosphere of Ar and N$_2$ using a target of W or WSi$_x$ (FIG. 31E).

Figure 31F:
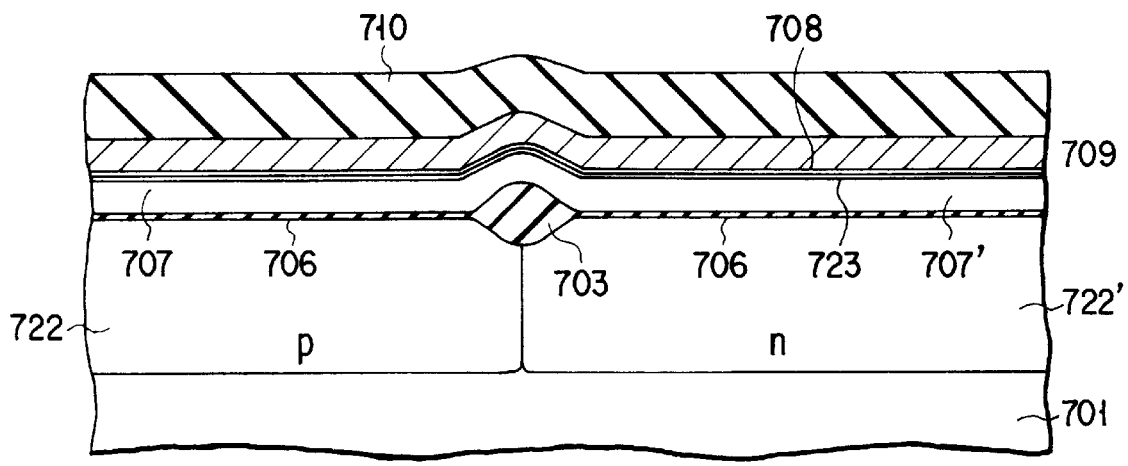
Figure 31G:
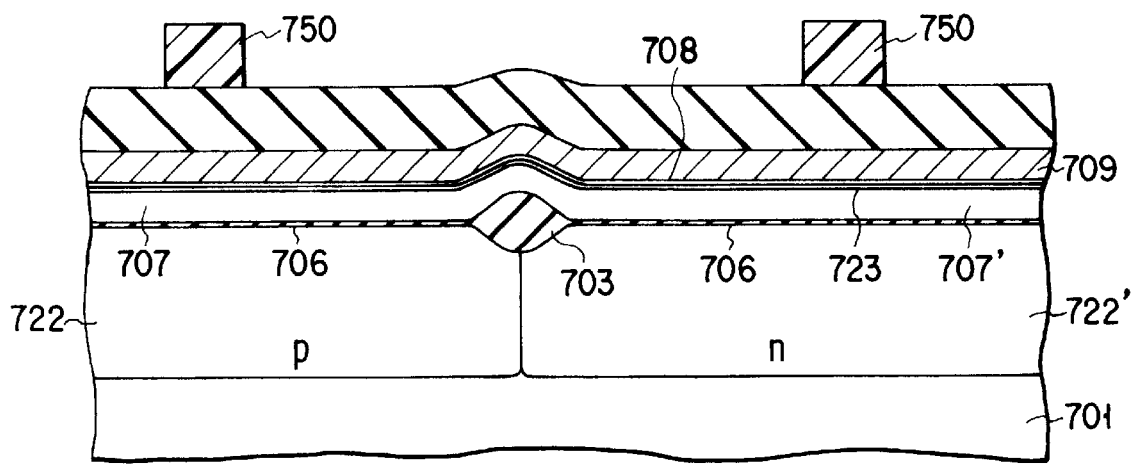

Then, a W film 709 of 100 nm thickness is formed by effecting the sputtering process in an Ar gas atmosphere using a target of W or by the CVD method of WF$_6$ series (FIG. 31F).

After this, an SiN$_x$ film 710 of 250 nm thickness is formed by effecting the LPCVD method at 800° C. for 30 minutes (FIG. 31F). At this time, in the conventional process, impurities in the n$^+$- and p$^+$-type polysilicon layers are diffused from the polysilicon layers 707 and 707' to the W film 709 to cause the gate depletion and interdiffusion of the p- and n-type impurities. However, in this embodiment, diffusion of impurities from the silicon films to the W film can be prevented by using the diffusion preventing film WSi$_x$N$_y$ 708 of this invention. As a result, the gate depleting action shown in FIG. 29B and interdiffusion shown in FIG. 30B can be prevented.

Then, a resist pattern 750 is formed in a desired form of gate electrodes or gate wirings by use of the photolithography technology (FIG. 31G) and the SiN$_x$ film 710 is patterned by the RIE method with the resist pattern 750 used as a mask. Next, the resist 750 is removed by use of asher and the W film 709, WSi$_x$N$_y$ film 708, WSi$_x$ film 723 and Si film 707 or 707' are patterned by the RIE method with the patterned SiN$_x$ film 710 used as a mask so as to form the gate electrodes or wirings (FIG. 31H).

Next, the selective oxidation is effected at 800° C. for 30 minutes in an H$_2$O, H$_2$, N$_2$ gas atmosphere. In this case, only silicon is oxidized without oxidizing W by the selective oxidation so as to form oxide films 711 on the side surfaces of silicon portions of the gate electrodes and the silicon substrate.

Then, As is ion-implanted into the source/drain regions of the p-type region 722 in a condition of the acceleration voltage 20 keV and dose amount $5\times10^{14}/$cm$^2$. Further, BF$_2$ is ion-implanted into the source/drain regions of the n-type region 722' in a condition of the acceleration voltage 20 keV and dose amount $5\times10^{14}/$cm$^2$. Thus, source/drain regions 712, 712' of low impurity concentration are formed (FIG. 31I).

Next, an SiN$_x$ film of approximately 50 nm thickness is formed by the CVD method and an SiN$_x$ film 713 is formed on the gate side wall by anisotropic etching by use of the RIE method (FIG. 31I).

After this, As is ion-implanted into the source/drain regions of the p-type region 722 in a condition of the acceleration voltage 60 keV and dose amount $7\times10^{15}/$cm$^2$. Further, BF$_2$ is ion-implanted into the source/drain regions of the n-type region 722' in a condition of the acceleration voltage 60 keV and dose amount $7\times10^{15}/$cm$^2$. Thus, source/drain regions 714, 714' which are deep as shown in FIG. 28 are formed.

Then, inter-level films are formed by the normal method and Al wirings are formed so as to provide a highly reliable complementary MOSFET.

According to this invention, diffusion of impurity in silicon into metal or metal silicide in the heat treatment can be suppressed by forming the diffusion preventing layer on the interface between silicon and metal or metal silicide. For example, if a WSi$_x$N$_y$ film is used as the diffusion preventing layer and a laminated structure of W/WSi$_x$N$_y$/Si is formed, the As concentration in W becomes $1\times10^{18}/$cm$^3$ or less when a sample containing As of $1\times10^{20}/$cm$^3$ in Si is subjected to the heat treatment at 950° C. for 30 minutes. Therefore, since the impurity concentration in W can be kept sufficiently low even if the above heat treatment is effected, the interdiffusion in the CMOSFET will not occur. Further, since the impurity concentration in Si can be kept at approximately $1\times10^{20}/$cm$^3$, the gate depleting action will not occur.

In the above embodiments, the polycide or polymetal structure using W-series metal as refractory metal is explained, but this invention is not limited to the embodiments and this invention can be attained by forming a diffusion preventing layer formed of an alloy containing refractory metal, silicon and nitrogen on the interface between refractory metal or refractory metal silicide and silicon. Further, the diffusion preventing layer may contain oxygen and carbon in addition to the above three elements.

As described above, according to the semiconductor device of this invention and the method for manufacturing the same, since diffusion of impurity in polysilicon into metal or metal silicide can be suppressed in an electrode or wiring of polycide or polymetal structure, a semiconductor device which is excellent in the electrical characteristic and is highly reliable and a method for manufacturing the same can be obtained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate; and a laminated film insulatively formed over said semiconductor substrate;

wherein said laminated film includes:

a semiconductor film having a side surface, an upper surface and a lower surface, a metal film of a first refractory metal formed on said semiconductor film, a conductive oxidation preventing film disposed between said metal film and said semiconductor film, for preventing oxidation of said semiconductor film in an interface between said metal film and said semiconductor film, and an oxide film formed on said side surface of said semiconductor film and formed to extend into said upper and said lower surface of said semiconductor film in a bird's beak form.

2. A semiconductor device according to claim 1, wherein said oxidation preventing film contains a second refractory metal, silicon and at least one selected from the group consisting of nitrogen and carbon.

3. A semiconductor device according to claim 2, wherein said semiconductor film is formed of silicon, and said second refractory metal is formed of metal in which a value obtained by subtracting an amount of drop in the Gibb's free energy, caused when at least one selected from the group consisting of a nitride and a carbide of silicon is formed, from an amount of drop in the Gibb's free energy, caused when at least one selected from the group consisting of a nitride and a carbide of said refractory metal is formed, is negative.

4. A semiconductor device according to claim 3, wherein at least one of said first and said second refractory metals is formed of at least one selected from the group consisting of Mo, W, Cr, Zn and Co.

5. A semiconductor device comprising:

a semiconductor region, having a side surface, an upper surface and a lower surface, formed on a substrate;

an insulating film formed on said semiconductor region so as to form an interface therebetween;

a metal film of a first refractory metal formed on said insulating film; and a conductive oxidation preventing film disposed between said metal film and said insulating film, for preventing oxidation of said semiconductor region in said interface between said insulating film and said semiconductor region, wherein an oxide film is formed on said side surface of said semiconductor region to extend into said upper and said lower surface of said semiconductor region in a bird's beak form.

6. A semiconductor device according to claim 5, wherein said oxidation preventing film contains a second refractory metal, silicon and at least one selected from the group consisting of nitrogen and carbon.

7. A semiconductor device according to claim 6, wherein said semiconductor region is formed of silicon, and said second refractory metal is formed of metal in which a value obtained by subtracting an amount of drop in the Gibb's free energy, caused when at least one selected from the group consisting of a nitride and a carbide of silicon is formed, from an amount of drop in the Gibb's free energy, caused when at least one selected from the group consisting of a nitride and a carbide of said refractory metal is formed, is negative.

8. A semiconductor device according to claim 7, wherein at least one of said first and said second refractory metals is formed of at least one selected from the group consisting of Mo, W, Cr, Zn and Co.

9. A semiconductor device according to claim 5, wherein said semiconductor region is formed of a semiconductor substrate.

10. A semiconductor device according to claim 5, wherein said semiconductor region is formed of a semiconductor film disposed on a semiconductor substrate.

11. A semiconductor device according to claim 1, wherein said oxidation preventing film includes tungsten, silicon and nitrogen, and a content of said silicon is more than 5 times that of either of said tungsten and said nitrogen.

12. A semiconductor device according to claim 1, wherein said oxidation preventing film is formed of one layer.

* * * * *